US012791946B2

(12) United States Patent
Feldmann et al.

(10) Patent No.: US 12,791,946 B2
(45) Date of Patent: Nov. 10, 2026

(54) OPTICAL SYSTEM, LITHOGRAPHY APPARATUS AND METHOD

(71) Applicant: Carl Zeiss SMT GmbH, Oberkochen (DE)

(72) Inventors: Heiko Feldmann, Aalen (DE); Stefan Hembacher, Bobingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 85 days.

(21) Appl. No.: 18/357,540

(22) Filed: Jul. 24, 2023

(65) Prior Publication Data

US 2023/0367227 A1 Nov. 16, 2023

Related U.S. Application Data

(63) Continuation of application No. PCT/EP2022/050134, filed on Jan. 5, 2022.

(30) Foreign Application Priority Data

Jan. 25, 2021 (DE) ......................... 102021200604.3

(51) Int. Cl.
*G03F 7/20* (2006.01)
*G02B 17/08* (2006.01)
*G03F 7/00* (2006.01)

(52) U.S. Cl.
CPC ..... *G03F 7/70266* (2013.01); *G02B 17/0836* (2013.01); *G03F 7/70233* (2013.01)

(58) Field of Classification Search
CPC ............. G03F 7/70266; G03F 7/70233; G02B 17/0836; G02B 26/0825
See application file for complete search history.

(56) References Cited

U.S. PATENT DOCUMENTS 3,637,296 A 1/1972 Mclafferty et al.
3,731,992 A 5/1973 Mansell
4,264,146 A 4/1981 Sutton
9,513,569 B2 12/2016 Dieterich et al.
(Continued)

FOREIGN PATENT DOCUMENTS

DE 102014206587 A1 4/2015
DE 10 2019 217 530 A1 12/2019
(Continued)

OTHER PUBLICATIONS

Translation of International Search Report for corresponding PCT Appl No. PCT/EP2022/050134, dated Apr. 22, 2022.
(Continued)

*Primary Examiner* — Mesfin T Asfaw
(74) *Attorney, Agent, or Firm* — Fish & Richardson P.C.

(57) ABSTRACT

An optical system for a lithography apparatus includes an optical element. The optical element comprises a substrate, an optically effective area provided on the substrate, and a plurality of channels which run through the substrate and to which a pressure can be applied via a fluid. An initial surface profile and a target surface profile different from the initial surface profile are associated with the optically effective area. The optically effective area can be switched from the initial surface profile to the target surface profile by applying pressure and a resulting deformation of the channels.

22 Claims, 26 Drawing Sheets

(56) References Cited

U.S. PATENT DOCUMENTS

| | | | |
|---|---|---|---|
| 2002/0011573 A1 | 1/2002 | Van Dijsseldonk et al. | |
| 2004/0036940 A1 | 2/2004 | Hazelton | |
| 2004/0240078 A1 | 12/2004 | Sekiyama | |
| 2005/0099611 A1 | 5/2005 | Sogard | |
| 2008/0239503 A1* | 10/2008 | Conradi | G03F 7/70825 359/666 |
| 2010/0020423 A1 | 1/2010 | Phillips | |
| 2011/0255068 A1 | 10/2011 | Kools | |
| 2012/0075732 A1 | 3/2012 | Griffith | |
| 2013/0003167 A1 | 1/2013 | Dieterich et al. | |
| 2013/0094007 A1 | 4/2013 | Thovex et al. | |
| 2014/0340659 A1 | 11/2014 | Van Schoot et al. | |
| 2017/0315453 A1 | 11/2017 | Bauer et al. | |

FOREIGN PATENT DOCUMENTS

| | | | |
|---|---|---|---|
| DE | 102021200788 | A1 | 7/2022 |
| DE | 102021207580 | A1 | 1/2023 |
| EP | 1 174 770 | A2 | 1/2002 |
| EP | 1 376 192 | A2 | 1/2004 |
| EP | 1174770 | A3 | 5/2004 |
| EP | 2 258 656 | A1 | 12/2010 |
| JP | 2000221421 | A | 8/2000 |
| WO | WO 2013/113634 | A2 | 8/2013 |
| WO | WO 2019/206637 | A1 | 10/2019 |
| WO | WO 2020/079169 | A1 | 4/2020 |

OTHER PUBLICATIONS

Non-Final Office Action for U.S. Appl. No. 18/322,009, dated Dec. 4, 2024.

Final Office Action received in U.S. Appl. No. 18/322,009, mailed on Jun. 6, 2025, 39 pages.

Office Action in U.S. Appl. No. 18/322,009, mailed on Apr. 1, 2026, 19 pages.

Notice of Allowance received in U.S. Appl. No. 18/322,009, mailed on May 20, 2026, 17 pages.

Office Action in German Appln. No. 10 2021 200 604.3, mailed on Jun. 30, 2021, 12 pages (with English translation).

Office Action in Chinese Appln. No. 202280011254.6, mailed on May 6, 2026, 18 pages (with English translation).

Search Report in Chinese Appln. No. 202280011254.6, mailed on Apr. 30, 2026, 6 pages (with English translation).

* cited by examiner

OPTICAL SYSTEM, LITHOGRAPHY APPARATUS AND METHOD

CROSS-REFERENCE TO RELATED APPLICATIONS

The present application is a continuation of, and claims benefit under 35 USC 120 to, international application PCT/EP2022/050134, filed Jan. 5, 2022, which claims benefit under 35 USC 119 of German Application No. 10 2021 200 604.3, filed Jan. 25, 2021. The entire disclosure of each these applications is incorporated by reference herein.

FIELD

The present disclosure relates to an optical system, to a lithography apparatus with such an optical system and to a method for producing such an optical system.

BACKGROUND

Microlithography is used for the production of microstructured component parts, such as for example integrated circuits. The microlithography process is performed with a lithography apparatus, which has an illumination system and a projection system. The image of a mask (reticle) illuminated via the illumination system is projected here via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, EUV lithography apparatuses (extreme ultraviolet, EUV) that use light with a wavelength in the range of 0.1 nm to 30 nm, in particular 13.5 nm, are currently under development. In the case of such EUV lithography apparatuses, because of the high absorption of light of this wavelength by most materials, reflective optical units, that is to say mirrors, are commonly used instead of—as previously—refractive optical units, that is to say lens elements.

Such optical units can be moved with the aid of actuators in six degrees of freedom, that is to say in three translatory degrees of freedom and in three translatory degrees of freedom. In addition, it is possible, for example for the active control of aberrations, to deform an optically effective surface of such an optical unit. As a result, a surface profile or deformation profile of the optically effective surface can be influenced. In order to achieve a specific intended optical effect, the desired deformation profile of the optical surface is largely predetermined. A system often only needs one or a few of these deformation profiles on an optical surface. This is often the case in particular when the optical surface is located neither in a field-conjugate plane nor in a pupil-conjugate plane.

SUMMARY

The present disclosure seeks to provide an improved optical system for a lithography apparatus.

Accordingly, in a first aspect, the disclosure provides an optical system for a lithography apparatus, which comprises an optical element which comprises a substrate and an optically effective surface provided on the substrate, a multiplicity of channels which run through the substrate and can be subjected to pressure with the aid of a fluid, wherein the optically effective surface is assigned an initial surface profile and a target surface profile that differs from the initial surface profile, and wherein the optically effective surface can be switched from the initial surface profile to the target surface profile by being subjected to pressure and resultant deformation of the channels.

Because the channels are provided, in general, any desired target surface profile can be predetermined at the time of design, depending on the arrangement or geometry of the channels. By subjecting the channels to pressure, it is thus possible to deform the optically effective surface as desired, depending on the configuration of the channels.

The optical system may be a projection system of an EUV lithography apparatus or part of such a projection system. However, the optical system may also be part of a beam-shaping and illumination system of an EUV lithography apparatus. However, the optical system may also be part of a DUV lithography apparatus. In the following it is assumed however that the optical system is part of an EUV lithography apparatus and in particular part of a projection system of an EUV lithography apparatus.

The optical element can be a mirror. However, the optical element may also be any other desired optical element, such as a lens element. The substrate can be a mirror substrate. The substrate may be a glass block, in particular a glass-ceramic block. The substrate can be a block made of Ultra Low Expansion Glass (ULE). The substrate may be composed of a number of substrate blocks. The substrate has for example a cuboidal geometry. The substrate may be for example rectangular, square, oval or triangular in plan view.

In general, the substrate comprises a front side, on which the optically effective surface is provided, and a back side facing away from the front side. The optically effective surface has reflective properties. This means that the optically effective surface is suitable for reflecting EUV radiation. The optically effective surface may be a mirror surface. Optionally, the back side of the substrate has no reflective properties. A coordinate system with an x direction or width direction, a y direction or height direction and a z direction or depth direction can be assigned to the optical element or the substrate. The directions are oriented perpendicularly to one another.

That the channels "run through" the substrate means in the present case that the channels are arranged within the substrate and are surrounded by the substrate. In this case, the channels may be positioned below the optically active surface with respect to the height direction of the substrate. In the present case, a "channel" may be understood as meaning a tubular geometry. In particular, a "channel" is to be understood in the present case as an elongate geometry whose length, viewed for example along the depth direction, is many times greater than its width, viewed for example along the width direction, and its height, viewed for example along the height direction.

The channels can have a rectangular geometry in cross section. In general, however, the cross-sectional geometry of the channels can be selected as desired. Each channel can comprise a bottom, a top arranged opposite the bottom and two side walls arranged opposite one another. The bottom, the top and the side walls run continuously through the substrate. That is to say that the bottom, the top and the side walls might not segmented or interrupted. Alternatively, the channels may also be divided into interconnected cells.

The fluid may be for example water, such as high-purity water, or a gas, such as for example air. Water is relatively incompressible, which means that the channels can be subjected to pressure more quickly. That the channels "can be subjected" to pressure means in the present case that the fluid can be put under pressure with the aid of a pressure generating device, for example with the aid of a pump.

The fluid in turn can exert this pressure evenly on the bottom, the top and the side walls. As a result, the channels can be deformed from an undeformed state into a deformed state. The substrate can also be deformed elastically, such as resiliently, as a result of which the optically effective surface is deformed and, starting from the initial surface profile, the target surface profile can be achieved. Generally, the higher the pressure, the more the optically effective surface is deformed. As soon as the channels are pressureless, in general, they are automatically deformed back from the deformed state into the undeformed state. Accordingly, the optically effective surface can also be deformed back from the target surface profile into the first initial surface profile.

That the initial surface profile and the second target surface profile are "assigned" to the optically effective surface means in the present case that the optically effective surface assumes the initial surface profile in an undeformed state and the target surface profile in a deformed state. This means that the optically effective surface assumes the form of the initial surface profile in its undeformed state. Accordingly, the optically effective surface assumes the target surface profile in its deformed state.

That is to say that a geometry of the optically effective surface corresponds either to the initial surface profile or to the target surface profile. The optically effective surface therefore cannot assume the geometry of the initial surface profile and the target surface profile at the same time. The initial surface profile and the target surface profile can be any desired three-dimensionally curved surfaces. The initial surface profile and the target surface profile may only differ from one another for example in their deformation amplitude, but otherwise be identical. Furthermore, the initial surface profile may also be flat and the target surface profile has any desired three-dimensionally curved form.

When the channels are subjected to pressure, the optically effective surface is switched from the initial surface profile to the target surface profile. This may take place for example at a defined pressure of 1 bar. In the present case, that the optically effective surface is "switched" means in particular that the optically effective surface either assumes the geometry of the initial surface profile or is deformed into the geometry of the target surface profile. This may take place for example by the pressureless channels being subjected to pressure with a pressure of 1 bar with the aid of the fluid.

According to an embodiment, the optically effective surface is assigned a number of target surface profiles, which only differ from one another in their deformation amplitude, with each target surface profile being assigned a predetermined pressure.

A continuous transition from the initial surface profile to the target surface profile is thus possible by continuously varying the pressure. If the pressure is doubled, the deformation amplitude can be doubled, for example. The deformation amplitude is defined as a distance, viewed along the height direction of the substrate, between a lowest point and a highest point of the respective target surface profile. The target surface profiles do not differ from one another in their geometry, but only in the degree to which they are formed along the height direction of the substrate. For example, one, two or three target surface profiles may be provided. In this case, the optically effective surface may be deformed for example from the initial surface profile into a first target surface profile and from there into a second target surface profile. With a further increase in the pressure, the further target surface profiles are gradually achieved.

According to an embodiment, the channels are arranged in a common plane.

When viewed along the height direction, this common plane is placed below the optically effective surface. The common plane may be positioned parallel to the optically effective surface. The common plane is spanned by the width direction and the depth direction of the substrate or is arranged parallel to a plane spanned by the width direction and the depth direction.

According to an embodiment, the channels are arranged such that they are distributed over a number of different planes.

For example, two such planes are provided, which are spaced apart from one another and arranged parallel to one another when viewed along the height direction of the substrate. The channels of the two planes may differ from one another in their dimensions. However, the channels in the two planes may also be constructed identically. For example, one plane may be assigned to the optically effective surface, and the other plane may then be assigned to the back side of the substrate.

According to an embodiment, the channels have a greater geometrical extent when viewed along a width direction of the substrate than when viewed along a height direction of the substrate.

That is to say that a width of the channels is greater than a height of the same. For example, the channels have an aspect ratio of less than 1. The aspect ratio of a channel is defined as the ratio of the height of the respective channel to the width of the respective channel. For the case where the channels have an aspect ratio of less than 1, they are positioned horizontally. Alternatively, the channels may also be positioned vertically. In this case, they have an aspect ratio of greater than 1.

According to an embodiment, the channels are arranged closer to the optically effective surface than to a back side of the substrate when viewed along the height direction.

As a result, it can be achieved that the optically effective surface is deformed more than the back side of the substrate. Alternatively, the channels may also be arranged centrally in the substrate with respect to the height direction. As previously mentioned, for the case where the channels are divided into two different planes, one of the planes may be placed close to the optically effective surface and the other plane close to the back side of the substrate.

According to an embodiment, the channels are arranged spaced apart unequally from one another when viewed along the width direction.

This makes it possible to optimize the deformation of the optically effective surface and to predetermine a defined desired surface profile of the optically effective surface. The desired surface profile may be a calculated surface profile of the optically effective surface. It is possible that the target surface profile matches the desired surface profile or deviates only minimally from it. A distance between two adjacent channels is also referred to as a pitch. The pitch may be uneven or even when viewed along the width direction.

According to an embodiment, the channels run along a depth direction of the substrate and parallel to one another.

The channels may also run along the width direction. The channels have their greatest geometrical extent in the substrate along the depth direction. The width of the channels extends along the width direction of the substrate. The height of the channels extends along the height direction of the channels. The geometrical extent of the channels along the depth direction is in this case a multiple of the extent of the channels along the width direction and along the height direction.

According to an embodiment, the channels are connected in series.

In particular, the channels are assigned a common inlet, via which the fluid can be subjected to pressure with the aid of the pressure generating device. Alternatively, the channels may also be connected in parallel. In this case, the channels can be connected to the inlet in a comb-like manner. In this case, two groups of channels may be provided, each of which is assigned an inlet. The channels can then engage in one another in a comb-like manner.

According to an embodiment, the channels are divided into a multiplicity of cells connected in series.

The cells may each have a cuboidal geometry. The cells of a channel may differ from one another in their geometry. This can help make it possible to optimize the target surface profile.

According to an embodiment, the cells differ from one another in their width and/or their height.

This applies in particular to the cells of one respective channel. The cells may be optimized in their width and/or in their height in such a way that a three-dimensional target surface profile of the optically effective surface can be achieved. The cells may also differ from one another by a length extending in the depth direction.

According to an embodiment, the cells of each channel are connected to one another with the aid of connecting lines.

The connecting lines can be dimensioned in particular in such a way that they have no influence or optionally only a very small influence on the deformation of the optically effective surface.

According to an embodiment, the channels have a variable cross section.

This means for example that the cross section of the channels, viewed along the depth direction, changes in such a way that the channels have constrictions and expansions.

A lithography apparatus with such an optical system is also proposed.

The lithography apparatus may be an EUV lithography apparatus or a DUV lithography apparatus. EUV stands for "extreme ultraviolet" and refers to a wavelength of the working light of between 0.1 nm and 30 nm. DUV stands for "deep ultraviolet" and refers to a wavelength of the working light of between 30 nm and 250 nm. The lithography apparatus may comprise a number of such optical systems. As previously mentioned, the optical system may be a projection system or part of a projection system of an EUV lithography apparatus.

A method for producing an optical system for a lithography apparatus is also proposed. The method can comprise the steps: a) providing a first substrate block and a second substrate block separate from the first substrate block, b) introducing a multiplicity of channels into the first substrate block, c) closing the channels with the aid of the second substrate block, and d) connecting the first substrate block and the second substrate block.

The substrate blocks may be glass blocks, such as glass-ceramic blocks. That the first substrate block and the second substrate block are "separate" from one another means in the present case that the first substrate block and the second substrate block are two separate components. The channels may be introduced into the first substrate block for example by using a machining process or by using an etching process. The channels are closed by placing the second substrate block on the first substrate block. The first substrate block and the second substrate block may be connected to one another for example by using an optical bonding process.

"A" or "an" in the present case should not necessarily be understood to be restrictive to exactly one element. Instead, a number of elements, such as for example two, three or more, may also be provided. Nor should any other numeral used here be understood to the effect that there is a restriction to exactly the stated number of elements. Instead, unless indicated otherwise, numerical deviations upward and downward are possible.

The embodiments and features described for the optical system correspondingly apply to the lithography apparatus and/or the method and vice versa.

Further possible implementations of the disclosure also include combinations, not mentioned explicitly, of features or embodiments described above or hereinafter with respect to the exemplary embodiments. In this case, a person skilled in the art will also add indigo aspects as improvements or supplementations to the respective basic form of the disclosure.

Further configurations and aspects of the disclosure are the subject of the exemplary embodiments of the disclosure that are described hereinafter.

BRIEF DESCRIPTION OF THE DRAWINGS

The disclosure is explained in detail hereinafter on the basis of preferred embodiments with reference to the appended figures.

EXEMPLARY EMBODIMENTS

Unless indicated otherwise, elements that are identical or functionally identical have been provided with the same designations in the figures. It should also be noted that the illustrations in the figures are not necessarily true to scale. Hidden components are shown in the figures with dashed lines.

Figure 1A:
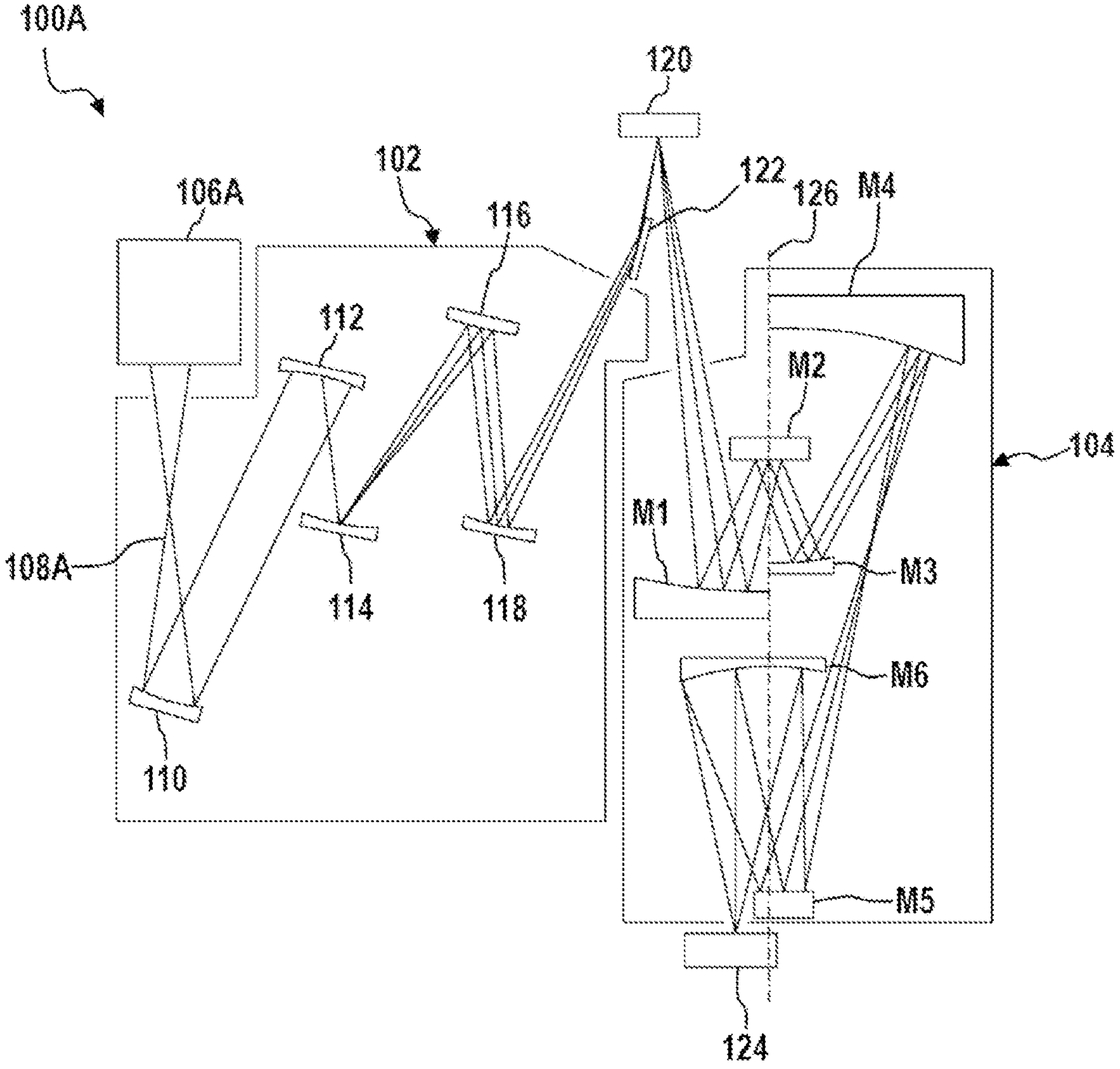
FIG. 1A shows a schematic view of an embodiment of an EUV lithography apparatus.

FIG. 1A shows a schematic view of an EUV lithography apparatus 100A comprising a beam-shaping and illumination system 102 and a projection system 104. In this case, EUV stands for "extreme ultraviolet" and refers to a wavelength of the working light of between 0.1 nm and 30 nm. The beam-shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Furthermore, electrical controllers and the like may also be provided in this machine room.

The EUV lithography apparatus 100A has an EUV light source 106A. A plasma source (or a synchrotron), which emits radiation 108A in the EUV range (extreme ultraviolet range), that is to say for example in the wavelength range of 5 nm to 20 nm, may be provided for example as the EUV light source 106A. In the beam-shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam-shaping and illumination system 102 and in the projection system 104 are evacuated.

The beam-shaping and illumination system 102 illustrated in FIG. 1A has five mirrors 110, 112, 114, 116, 118. After passing through the beam-shaping and illumination system 102, the EUV radiation 108A is guided onto a photomask (reticle) 120. The photomask 120 is likewise formed as a reflective optical element and may be arranged outside the systems 102, 104. Furthermore, the EUV radiation 108A may be directed onto the photomask 120 via a mirror 122. The photomask 120 has a structure which is imaged onto a wafer 124 or the like in reduced form via the projection system 104.

The projection system 104 (also referred to as a projection lens) has six mirrors M1 to M6 for imaging the photomask 120 onto the wafer 124. In this case, individual mirrors M1 to M6 of the projection system 104 may be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 may also be provided. Furthermore, the mirrors M1 to M6 are generally curved on their front side for beam shaping.

Figure 1B:
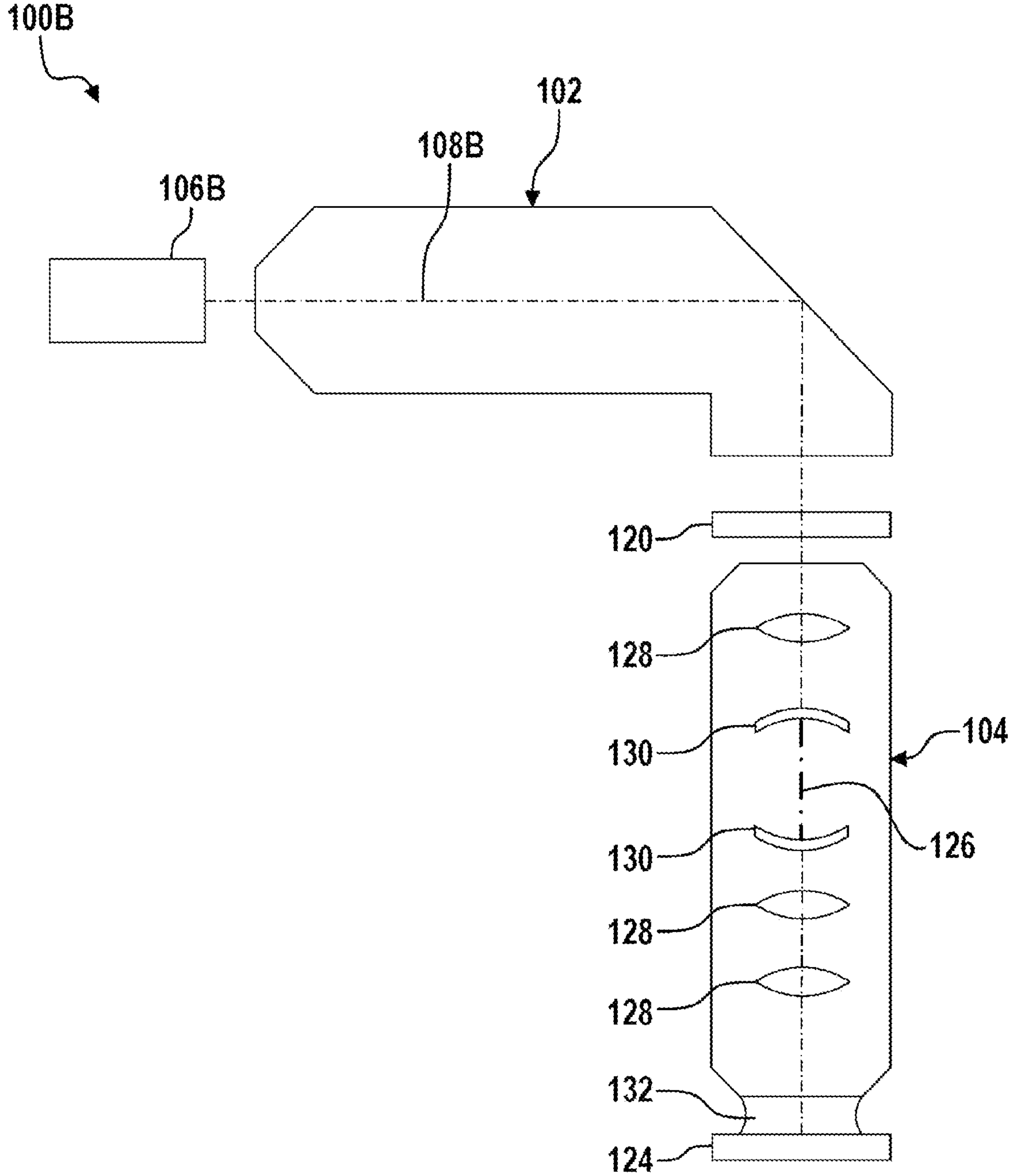
FIG. 1B shows a schematic view of an embodiment of a DUV lithography apparatus.

FIG. 1B shows a schematic view of a DUV lithography apparatus 100B, which comprises a beam-shaping and illumination system 102 and a projection system 104. In this case, DUV stands for "deep ultraviolet" and refers to a wavelength of the working light of between 30 nm and 250 nm. As has already been described with reference to FIG. 1A, the beam-shaping and illumination system 102 and the projection system 104 may be surrounded by a machine room with corresponding drive devices.

The DUV lithography apparatus 100B has a DUV light source 106B. An ArF excimer laser, which emits radiation 108B in the DUV range at for example 193 nm, may be provided for example as the DUV light source 106B.

The beam-shaping and illumination system 102 shown in FIG. 1B guides the DUV radiation 108B onto a photomask 120. The photomask 120 is formed as a transmissive optical element and may be arranged outside the systems 102, 104. The photomask 120 has a structure which is imaged onto a wafer 124 or the like in reduced form via the projection system 104.

The projection system 104 has a number of lens elements 128 and/or mirrors 130 for imaging the photomask 120 onto the wafer 124. In this case, individual lens elements 128 and/or mirrors 130 of the projection system 104 may be arranged symmetrically in relation to an optical axis 126 of the projection system 104. It should be noted that the number of lens elements 128 and mirrors 130 of the DUV lithography apparatus 100B is not restricted to the number shown. A greater or lesser number of lens elements 128 and/or mirrors 130 may also be provided. Furthermore, the mirrors 130 are generally curved on their front side for beam shaping.

An air gap between the last lens element 128 and the wafer 124 may be replaced by a liquid medium 132 having a refractive index>1. The liquid medium 132 may be for example high-purity water. Such a set-up is also referred to as immersion lithography and has an increased photolithographic resolution. The medium 132 may also be referred to as an immersion liquid.

Figure 2:
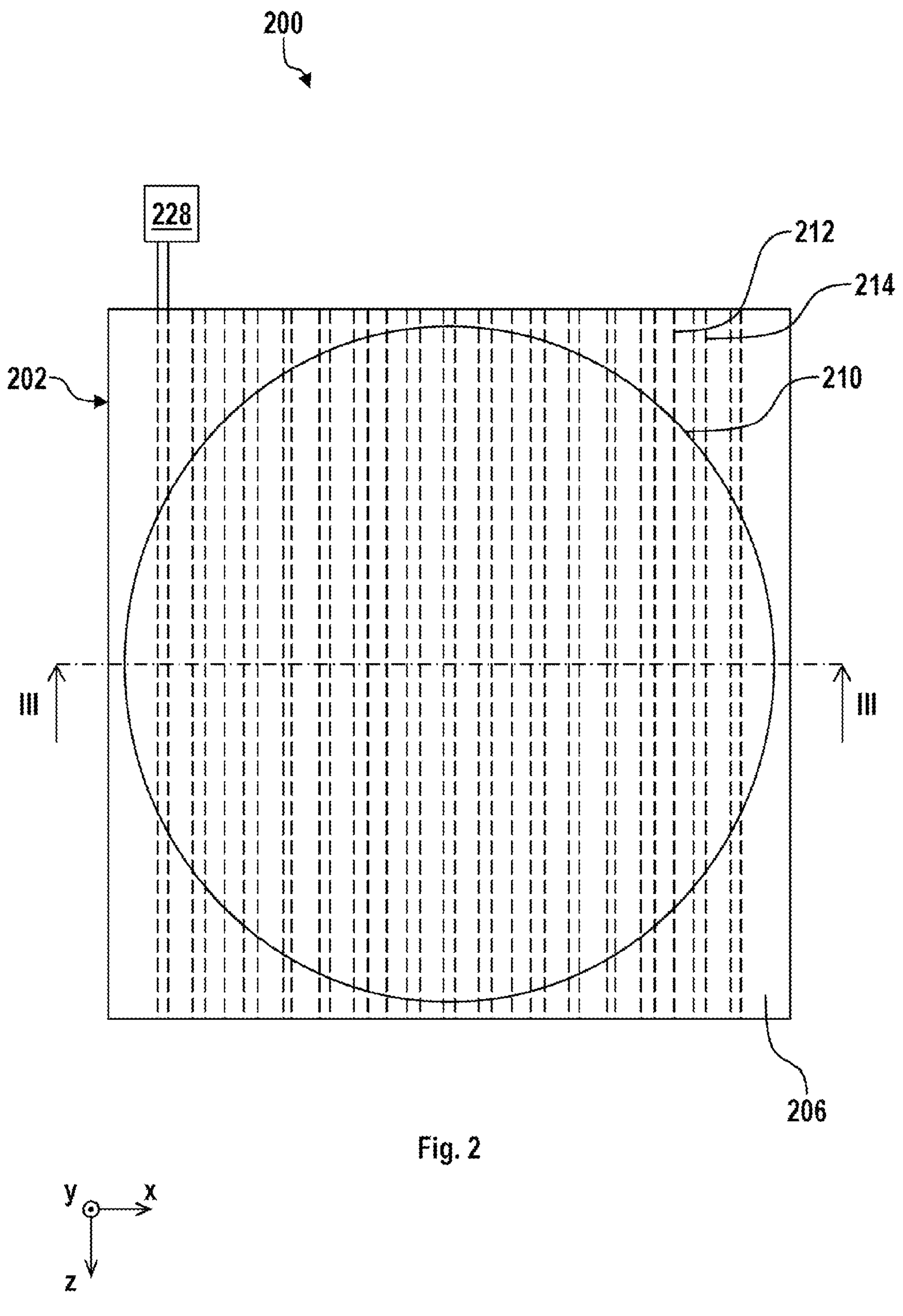
FIG. 2 shows a schematic plan view of an embodiment of an optical system for the lithography apparatus according to FIG. 1A or 1B.
Figure 3:
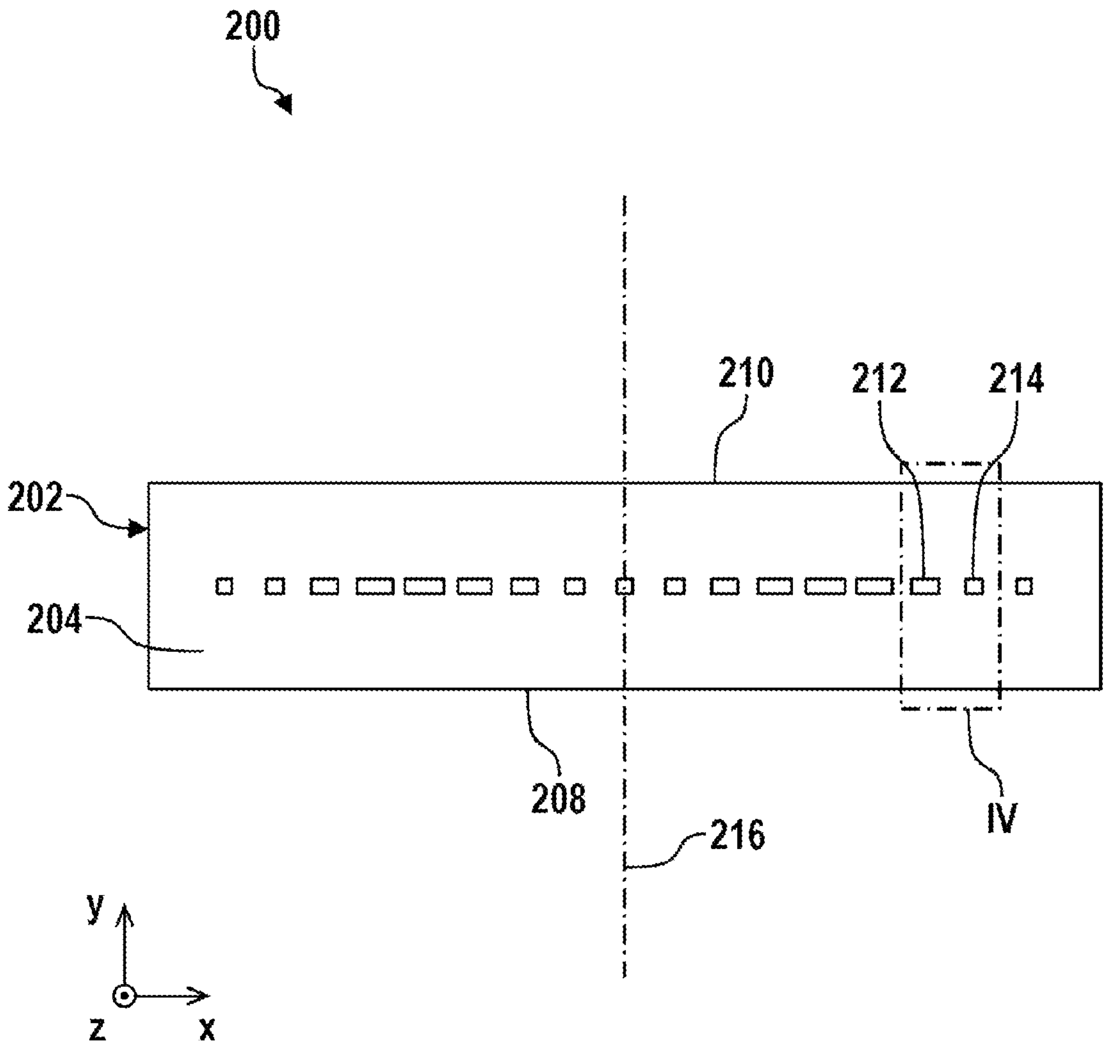
FIG. 3 shows a schematic sectional view of the optical system according to section line of FIG. 2.
Figure 4:
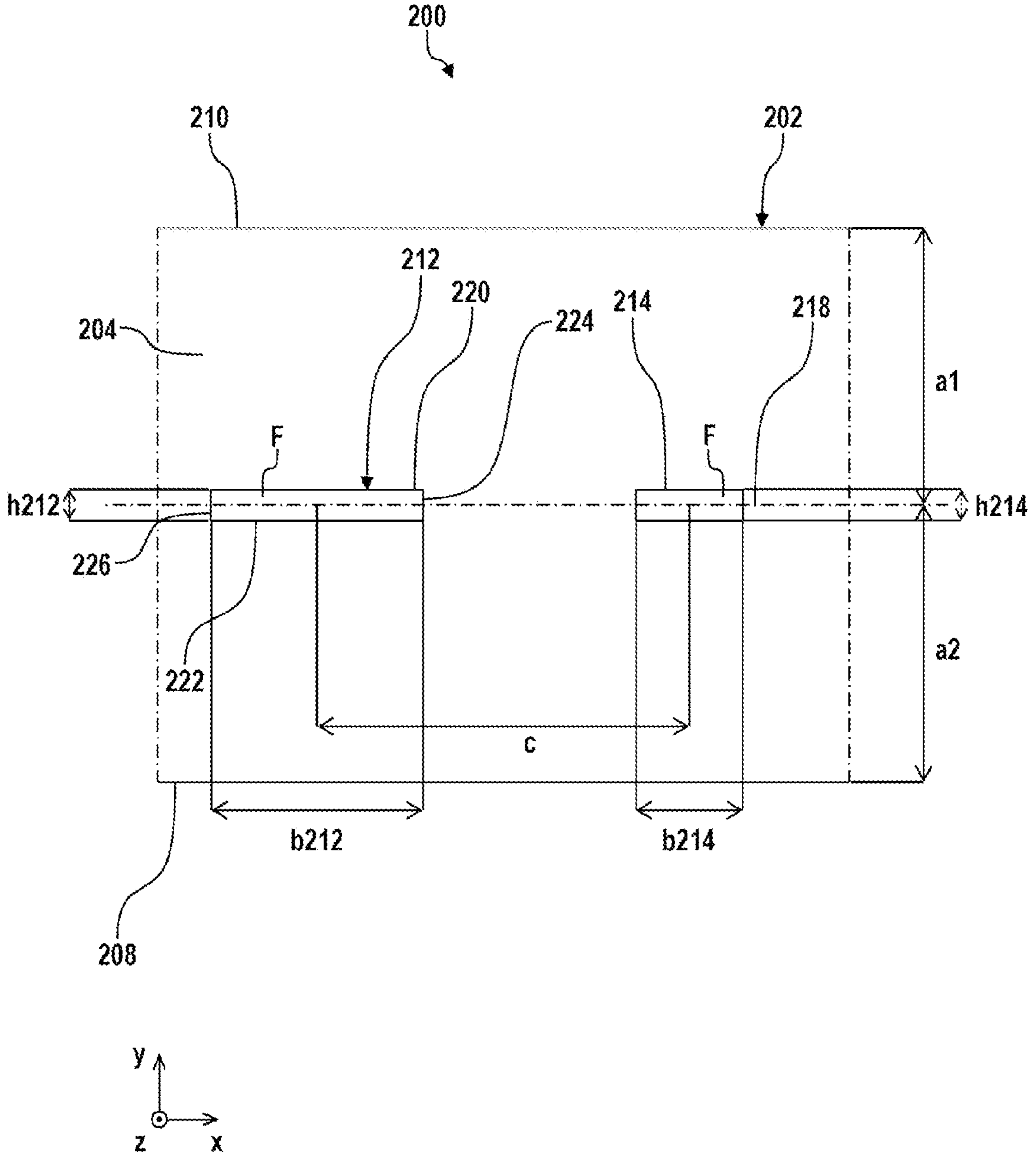
FIG. 4 shows the detailed view IV according to FIG. 3.
Figure 5:
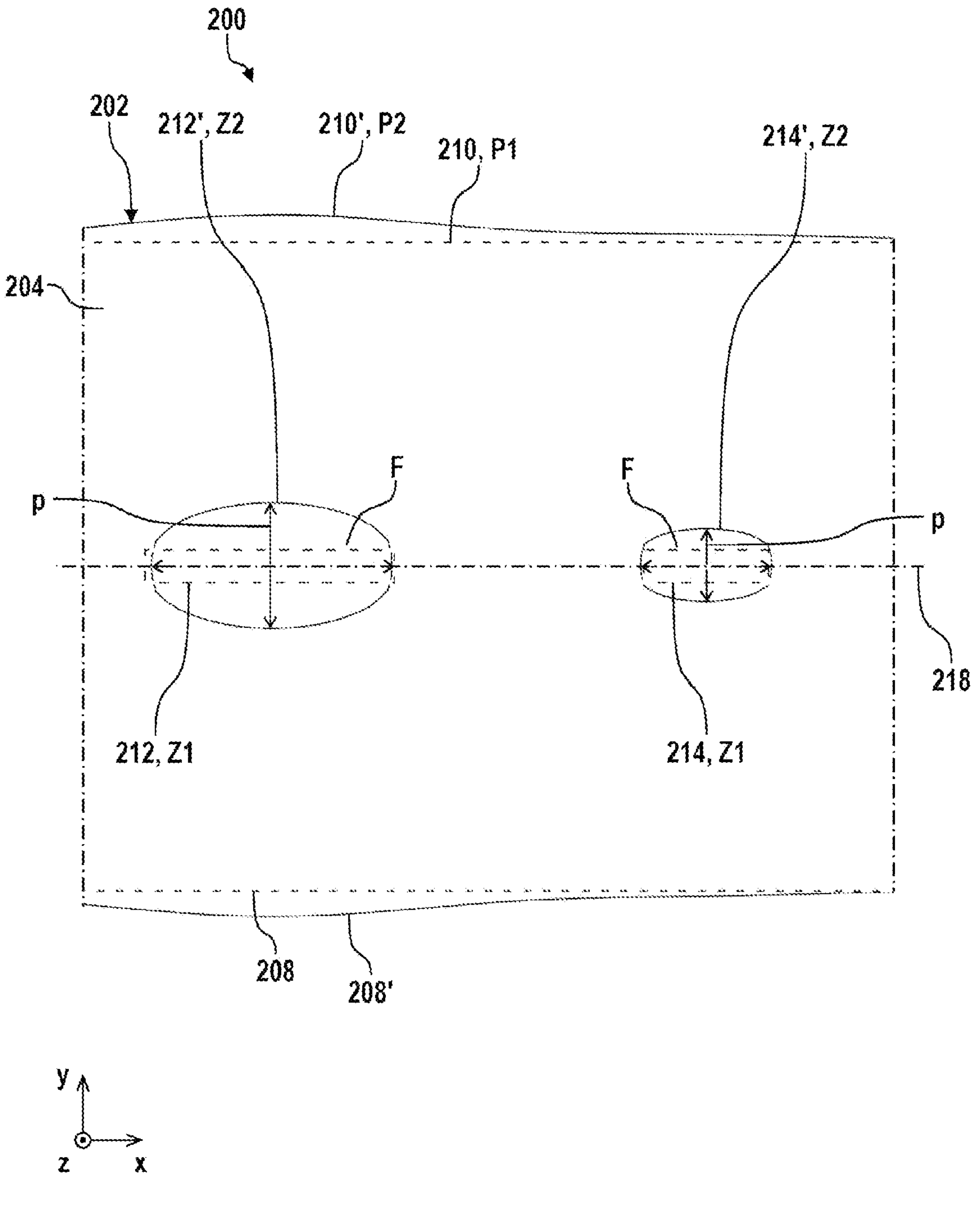
FIG. 5 again shows the detailed view IV according to FIG. 3.

FIG. 2 shows a schematic plan view of an embodiment of an optical system 200. FIG. 3 shows a schematic sectional view of the optical system 200 according to section line III-III of FIG. 2. FIGS. 4 and 5 each show the detailed view IV according to FIG. 3. In the following, reference is made to FIGS. 2 to 5 simultaneously.

The optical system 200 may be a projection system 104 of an EUV lithography apparatus 100A, as explained above, or part of such a projection system 104. However, the optical system 200 may also be part of a beam-shaping and illumination system 102 as explained above. However, the optical system 200 may also be part of a DUV lithography apparatus 100B. In the following it is assumed however that the optical system 200 is part of an EUV lithography apparatus 100A and in particular part of a projection system 104 of an EUV lithography apparatus 100A.

The optical system 200 comprises an optical element 202. The optical element 202 may be a mirror. For example, the optical element 202 may be one of the mirrors M1 to M6. In the plan view according to FIG. 2, the optical element 202 has a rectangular geometry. The optical element 202 may however have any desired geometry. For example, the optical element 202 may also be triangular, round or oval in plan view. The optical element 202 comprises a substrate 204, in particular a mirror substrate. The substrate 204 may be a glass-ceramic block. In particular, the substrate 204 is a block made of Ultra Low Expansion Glass (ULE). The substrate 204 may be composed of a number of substrate blocks.

A coordinate system with an x direction or width direction x, a y direction or height direction y and a z direction or depth direction z is assigned to the optical element 202. The directions x, y, z are oriented perpendicularly to one another.

The optical element 202 comprises a front side 206 and a back side 208 facing away from the front side 206. The front side 206 and the back side 208 may be arranged parallel to one another. When viewed along the height direction y, the front side 206 and the back side 208 are placed spaced apart from one another. An optically effective surface 210 is provided on the front side 206. The optically effective surface 210 is suitable for reflecting EUV radiation 108A. The back side 208 has no reflective properties. The optically effective surface 210 is a mirror surface. As shown in FIG. 2, the optically effective surface 210 may be circular. The optically effective surface 210 may however also be triangular, rectangular, hexagonal or oval. The geometry of the optically effective surface 210 is arbitrary.

Any desired number of channels 212, 214, only two of which are provided with a designation in FIGS. 2 to 5, have been introduced into the substrate 204. The channels 212, 214 run through the substrate 204 parallel to one another along the depth direction z. Alternatively, the channels 212, 214 may also run along the width direction x. The channels 212, 214 may be constructed and arranged mirror-symmetrically in relation to a plane of symmetry 216. The plane of symmetry 216 is spanned by the height direction y and the depth direction z. The number of channels 212, 214 is arbitrary.

As shown in FIG. 4, the channels 212, 214 are rectangular in cross section. In general, the channels 212, 214 may however have any desired geometry in cross section. The channels 212, 214 may be constructed mirror-symmetrically in relation to a plane of symmetry 218. The plane of symmetry 218 is spanned by the width direction x and the depth direction z. When viewed along the height direction y, the plane of symmetry 218 is placed centrally between the front side 206 or the optically effective surface 210 and the back side 208 of the optical element 202.

The plane of symmetry 218 runs centrally through the channels 212, 214 when viewed along the height direction y. The plane of symmetry 218 and thus the channels 212, 214 are arranged such that they are positioned spaced apart at a distance a1 from the optically effective surface 210 and at a distance a2 from the back side 208 when viewed along the height direction y. For the case where the plane of symmetry 218 or the channels 212, 214 are arranged centrally between the optically effective surface 210 and the back side 208, viewed along the height direction y, the distances a1, a2 are equal. The distances a1, a2 may however also be of different sizes. In this case, the plane of symmetry 218 and the channels 212, 214 are not arranged centrally in the optical element 202 when viewed along the height direction y.

The channels 212, 214 are arranged such that they are spaced apart from one another by a distance c when viewed along the width direction x. The distance c is defined as a distance between two points positioned centrally in the channels 212, 214 along the width direction x. The distance c may also be referred to as a pitch. The distance c is constant along the width direction x. That is to say that adjacent channels 212, 214 are always positioned spaced apart from one another by the distance c. The distance c may however also be varied along the width direction x. In this case, the channels 212, 214 are placed spaced apart unequally from one another when viewed along the width direction x.

The channel 212 has a height h212, viewed along the height direction y. Accordingly, the channel 214 has a height h214, viewed along the height direction y. The heights h212, h214 are identical. When viewed along the width direction x, the channel 212 has a width b212. Accordingly, the channel 214 has a width b214, viewed along the width direction x. The widths b212, b214 differ from one another. The width b212 is greater than the width b214.

The widths b212, b24 are greater than the heights h212, h214. That is to say that the width b212 is greater than the height h212, and the width b214 is greater than the height h214. An aspect ratio of the channel 212 is defined as the ratio of the height h212 to the width b212 (h212/b212). Accordingly, an aspect ratio of channel 214 is defined as the ratio of the height h214 to the width b214 (h214/b214). An aspect ratio of less than 1 applies to the respective channels 212, 214. This means that the channels 212, 214 each have a greater extent when viewed along the width direction x than when viewed along the height direction y.

The aspect ratio may however also be equal to 1. In this case, the channels 212, 214 are rectangular in cross section. Furthermore, the aspect ratio may also be greater than 1. In this case, the channels 212, 214 each have a smaller extent when viewed along the width direction x than when viewed along the height direction y. The channels 212, 214 are arranged horizontally in the substrate 204. "Horizontally"

means that the channels 212, 214 have a greater extent along the width direction x than along the height direction y.

Each channel 212, 214 has a top 220, assigned to the optically effective surface 210, a bottom 222, assigned to the back side 208, and two side walls 224, 226. That the top 220 is "assigned" to the optically effective surface 210 means in the present case that the top 220 is arranged closer to the optically effective surface 210 than to the back side 208 when viewed in the height direction y. The same applies correspondingly to the bottom 222. The channels 212, 214 may be implemented by being introduced into a glass block, in particular into a glass-ceramic block, either by machining or by using an etching process. In order to close the channels 212, 214 in the height direction y, another glass block is placed on the aforementioned glass block and optically bonded to it.

The channels 212, 214 are filled with a fluid F. The fluid F may be a gas or a liquid. For example, the fluid F may be air. The fluid F may also be water, in particular high-purity water. In the following it is assumed that the fluid F is water. The use of water means that the fluid F is relatively incompressible. With the aid of the fluid F, the channels 212, 214 can be subjected to pressure p in such a way that the channels 212, 214 are brought from an undeformed state Z1, shown with dashed lines in FIG. 5, into a deformed state Z2. In the deformed state Z2, the channels 212, 214 are denoted in FIG. 5 by the designations 212', 214'. Depending on the level of pressure p applied, any desired number of deformed states Z2 may be provided. The higher the pressure p, the greater the deformation of the channels 212, 214.

When the channels 212, 214 are brought from the undeformed state Z1 into the deformed state Z2, the substrate 204 is deformed elastically, in particular resiliently. This means that, as soon as the pressure p falls below a predetermined value, the substrate 204 is automatically deformed back, so that the channels 212, 214 are brought back from the deformed state Z2 into the undeformed state Z1.

All the channels 212, 214 are subjected to the same pressure p. For this purpose, the channels 212, 214 may be connected in series. The pressure p acts uniformly on the top 220, the bottom 222 and the side walls 224, 226. A pressure generating device 228 (FIG. 2) is provided for subjecting the channels 212, 214 to the pressure p. The pressure generating device 228 is set up to subject the fluid F to the pressure p. The pressure generating device 228 may be a pump.

As FIG. 5 shows, the channels 212, 214 expand along the height direction y when they are brought from the undeformed state Z1 into the deformed state Z2. In particular, the tops 220 or the bottoms 222 of the channels 212, 214 are deformed in the direction of the optically effective surface 210 or in the direction of the back side 208. That is to say that the heights h212, h214 of the channels 212, 214 become greater. At the same time, the channels 212, 214 contract along the width direction x. That is to say that the widths b212, b214 of the channels 212, 214 become smaller.

Due to the fact that the channels 212, 214 are deformed from the undeformed state Z1 into the deformed state Z2 when they are subjected to pressure, the optically effective surface 210 and the back side 208 are also deformed. In FIG. 5, the optically effective surface 210 or the back side 208 in a deformed state of the same are provided with the designations 210' and 208' respectively. Since the channels 212, 214 are placed centrally in the substrate 204 with respect to the height direction y, the optically effective surface 210 and the back side 208 are deformed to the same extent. By varying the distances a1, a2, it is possible to deform the optically effective surface 210 and the back side 208 to different extents when the channels 212, 214 are subjected to pressure. To bring the channels 212, 214 from the undeformed state Z1 into the deformed state Z2, they may for example be subjected to a pressure of 1 bar.

By bringing the channels 212, 214 from the undeformed state Z1 into the deformed state Z2, it is possible to set different surface profiles P1, P2 of the optically effective surface 210. An initial surface profile P1 of the optically effective surface 210, which is obtained in the undeformed state Z1 of the channels 212, 214, may be for example a flat surface. A target surface profile P2 of the optically effective surface 210 that differs from the initial surface profile P1 may be any desired three-dimensionally curved surface.

A surface profile P1, P2 of the optically effective surface 210 is assigned to each state Z1, Z2 of the channels 212, 214. That is to say that the number of surface profiles P1, P2 corresponds to the number of states Z1, Z2. In general, the number of states Z1, Z2 and the number of surface profiles P1, P2 is not limited. In particular, a number of, for example two or three, target surface profiles P2 are provided.

In order to be able to influence the target surface profile P2, it is possible to vary the following parameters. The target surface profile P2 may be influenced by varying the geometries of the channels 212, 214, that is to say changing the widths b212, b214 and the heights h212, h214, the distance c, the distances a1, a2 and the aspect ratios of the channels 212, 214. For example, an increase in the respective width b212, b214 with the same pressure p leads to greater deformation of the optically effective surface 210.

It is desirable for some optical applications that the target surface profile P2 is smooth. This means that the channels 212, 214 should not be perceptible on the respective target surface profile P2, that is to say that they should not "press through" to the optically effective surface 210.

Figure 6:
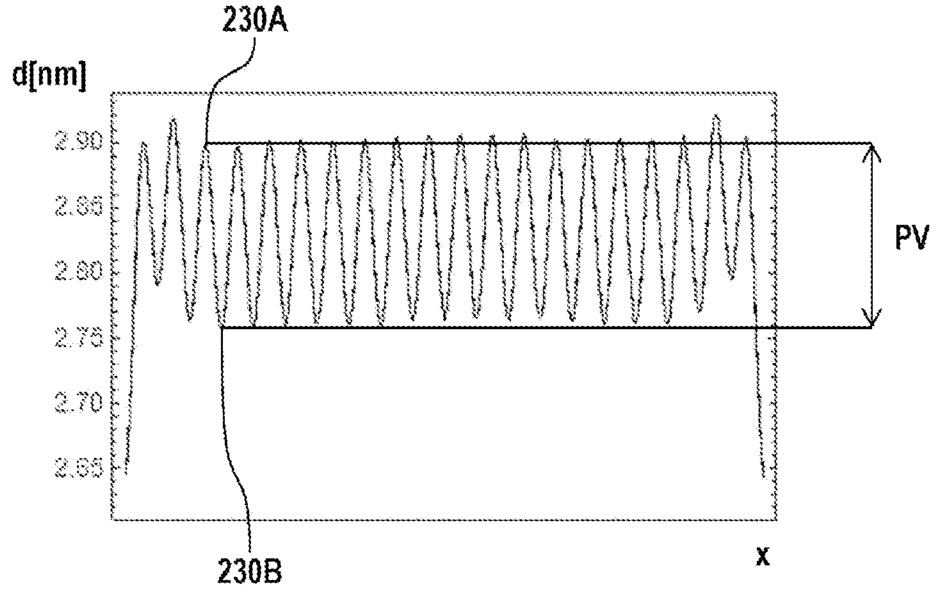
FIG. 6 shows a schematic diagram describing the optical system according to FIG. 2.
Figure 7:
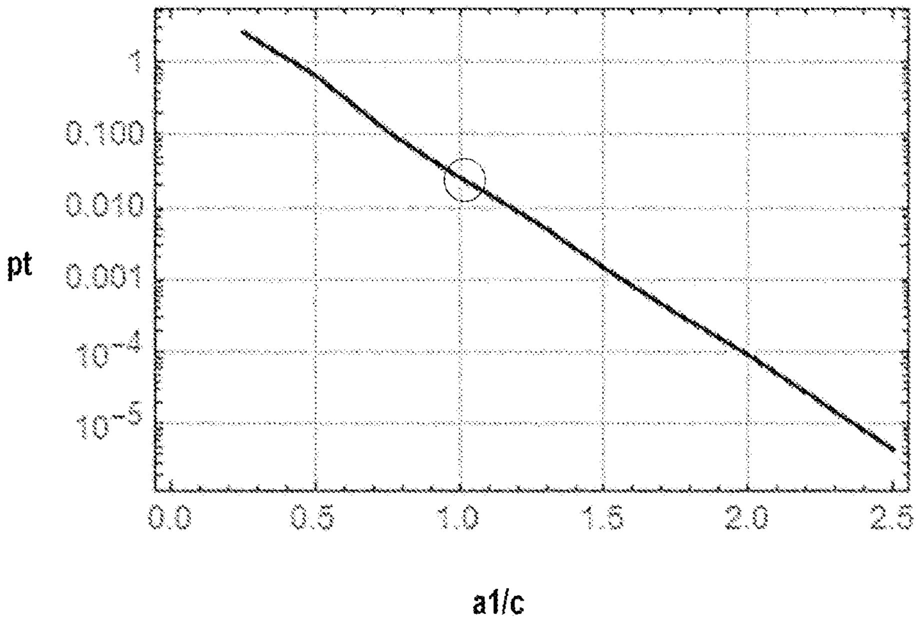
FIG. 7 shows a further schematic diagram describing the optical system according to FIG. 2.

FIGS. 6 and 7 each show a diagram relating to an embodiment of the optical element 202, which has a width of 400 mm along the width direction x and a height of 40 mm along the height direction y. The channels 212, 214 are embedded in the substrate 204 away from the optically effective surface 210 by a distance a1 of 20 mm along the height direction y. The distance c is 20 mm. This results in a ratio of the distance a1 to the distance c of 1 (a1/*c*=1).

FIG. 6 shows a deformation d of the optically active surface 210 with the aid of the channels 212, 214 at a pressure p of 1 bar. Here, the deformation d is plotted against the width direction x. Each peak 230A of the curve shown in FIG. 6 represents a channel 212, 214. A respective trough 230B of the curve represents a region of the optically effective surface 210 which is provided between two channels 212, 214. At a pressure p of 1 bar, a distance PV between the trough 230B and the peak 230A is 0.14 nm. A mean deformation and of the optically effective surface 210 is 2.8 nm. A print through pt of the channels 212, 214 is defined as follows:

$$pt = \frac{PV/2}{md}$$

With the above values, a value of 2.6% is obtained for the print through pt.

In FIG. 7, the print through pt is plotted against the ratio a1/*c* of the distances a1, c. The encircled area of the curve shown in FIG. 7 shows the example according to FIG. 6 with the ratio of the distance a1 to the distance c of 1 (a1/*c*=1).

As can be seen from FIG. 7, for a ratio of the distance a1 to the distance c of 2 (a1/c=2), a print through of less than 0.01% is obtained.

Figure 8:
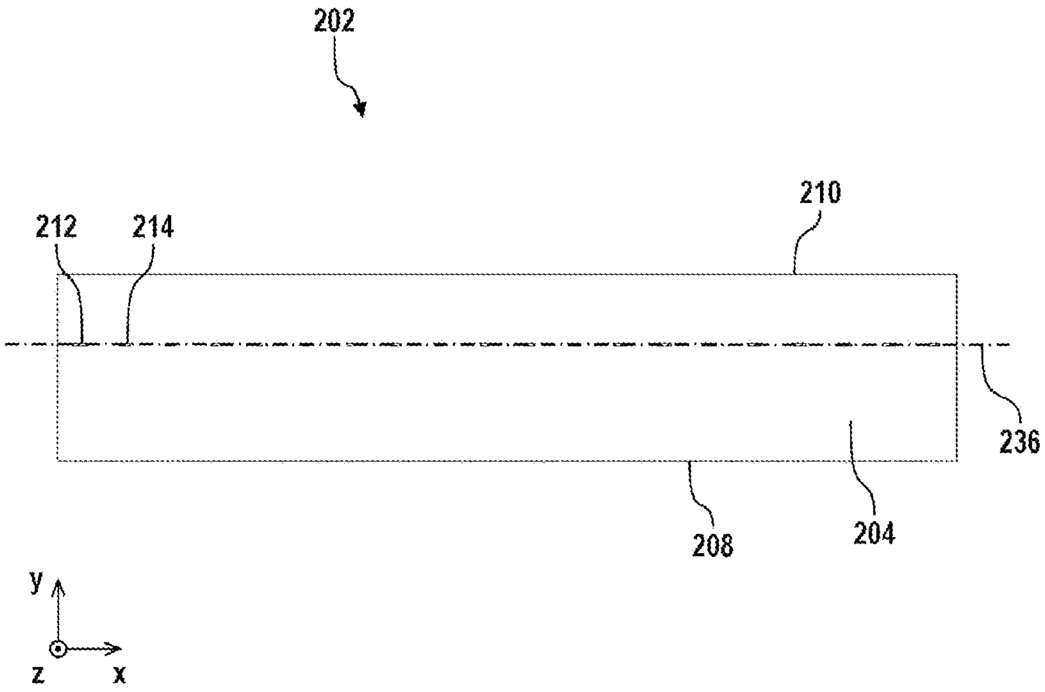
FIG. 8 shows a schematic sectional view of an embodiment of an optical element for the optical system according to FIG. 2.
Figure 9:
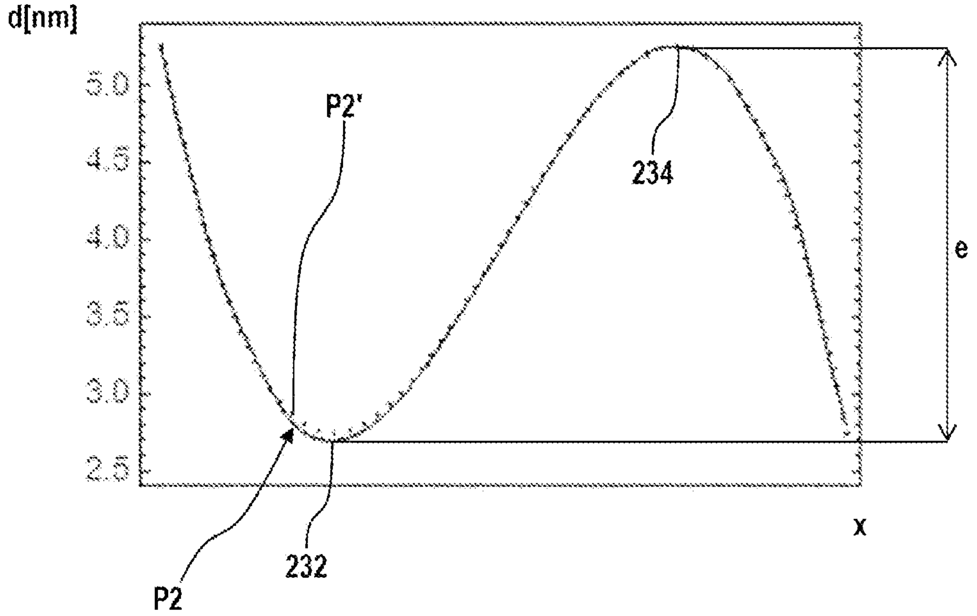
FIG. 9 shows a schematic diagram describing the optical element according to FIG. 8.

FIG. 8 shows a schematic sectional view of a further embodiment of an optical element 202. The optical element 202 has a width of 400 mm along the width direction x and a height of 80 mm along the height direction y. The distance a1 is 30 mm. An aspect ratio of less than 1 applies to the respective channels 212, 214. The distance c is 20 mm. The widths b212, b214 of the channels 212, 214 are not constant. The widths b212, b214 are optimized in such a way that, as shown in FIG. 9, when the channels 212, 214 are subjected to pressure, a calculated desired surface profile P2' is achieved from the initial surface profile P1. As already explained above, any desired number of target surface profiles P2 may be implemented with the aid of the channels 212, 214. These target surface profiles P2 might differ from one another in the degree of the deformation d.

In FIG. 9, the desired surface profile P2' is shown with a dotted line. The target surface profile P2 achieved from the initial surface profile P1 by subjecting the channels 212, 214 to pressure with a pressure p of 1 bar is shown in FIG. 9 with a solid line. As FIG. 9 shows, the target surface profile P2 approximately coincides with the desired surface profile P2'. A deformation principle of the channels 212, 214 is that of applying forces to the substrate 204, viewed along the height direction y. As a result, the deformation d of the optically effective surface 210 can be controlled directly.

As can be seen from FIG. 9, the deformation d occurs on a scale of 2.5 nm (deformation amplitude e between a trough 232 and a peak 234 of the curve shown in FIG. 9) with an offset of 4 nm. A stroke of about 2.5 nm can thus be achieved at a pressure p of 1 bar, viewed along the height direction y. Since the deformation d changes linearly with the pressure p, a deformation amplitude e of up to 20 nm can be realized at a maximum pressure of 8 bar. The channels 212, 214 are in this case placed in a common plane 236, as shown in FIG. 8.

Figure 10:
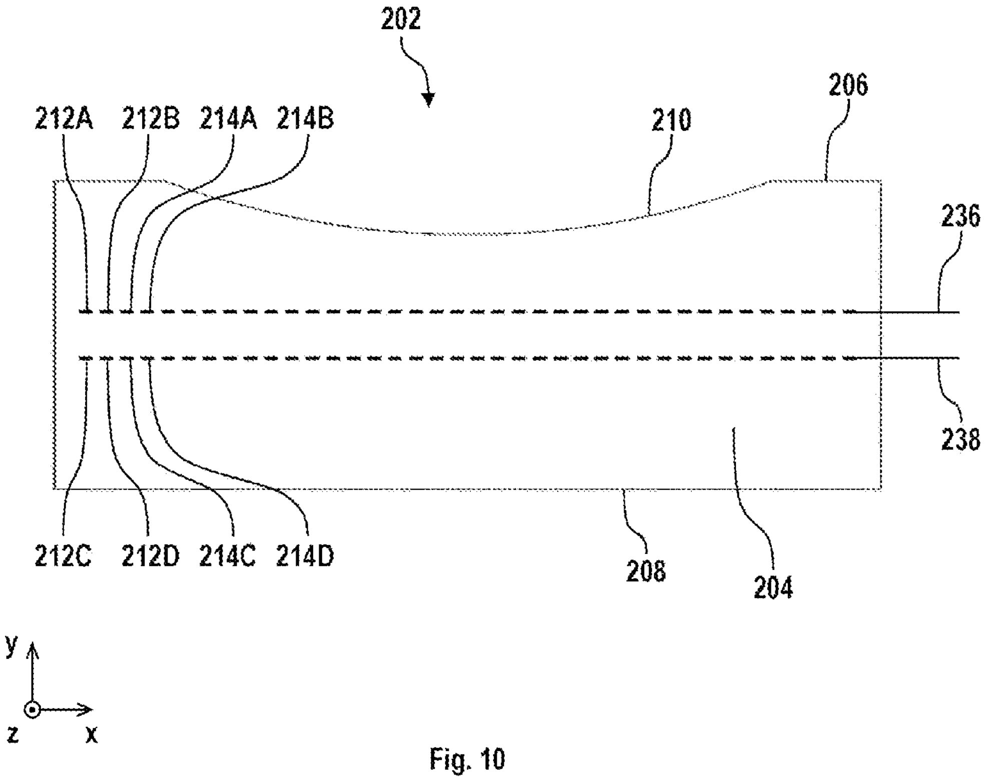
FIG. 10 shows a schematic sectional view of a further embodiment of an optical element for the optical system according to FIG. 2.

FIG. 10 shows a schematic sectional view of a further embodiment of an optical element 202. The optical element 202 comprises a curved optically effective surface 210. The optical element 202 has a width of 1000 mm along the width direction x and a height of 400 mm along the height direction y. An aspect ratio of less than 1 applies to the respective channels 212, 214.

In this embodiment of the optical element 202, it comprises first channels 212A, 214A, second channels 212B, 214B, third channels 212C, 214C and fourth channels 212D, 214D, each of which has a separate pressure supply. That is to say that the channels 212A, 214A have a common pressure supply. Accordingly, the channels 212B, 214B, 212C, 214C, 212D, 214D each have their own pressure supply. As a result, the channels 212A, 214A, 212B, 214B, 212C, 214C, 212D, 214D can be subjected to four different pressures p. It is also possible for only individual groups of the channels 212A, 214A, 212B, 214B, 212C, 214C, 212D, 214D to be subjected to pressure. For example, only the channels 212A, 214A are subjected to the pressure p and the channels 212B, 214B, 212C, 214C, 212D, 214D are not.

The channels 212A, 214A, 212B, 214B, 212C, 214C, 212D, 214D are divided into two planes 236, 238 placed spaced apart from one another in the height direction y. In this case, the channels 212A, 214A, 212B, 214B are placed in a first plane 236 and the channels 212C, 214C, 212D, 214D are placed in a second plane 238. The first plane 236 is placed closer to the optically effective surface 210 than the second plane 238 when viewed along the height direction y.

The channels 212A, 214A, 212B, 214B are arranged such that the channels 212A, 214A and the channels 212B, 214B are arranged alternately side by side. Correspondingly, the channels 212C, 214C and the channels 212D, 214D are also placed alternately. The distance c is 50 mm within a group of channels 212A, 214A, 212B, 214B, 212C, 214C, 212D, 214D. That is to say that the distance c between channels 212A, 214A, 212B, 214B, 212C, 214C, 212D that do not belong to a common group is 25 mm. This means for example that the distance c between the channels 212A, 214A is 50 mm and the distance c between the channels 212A, 212B is 25 mm.

Figure 11:
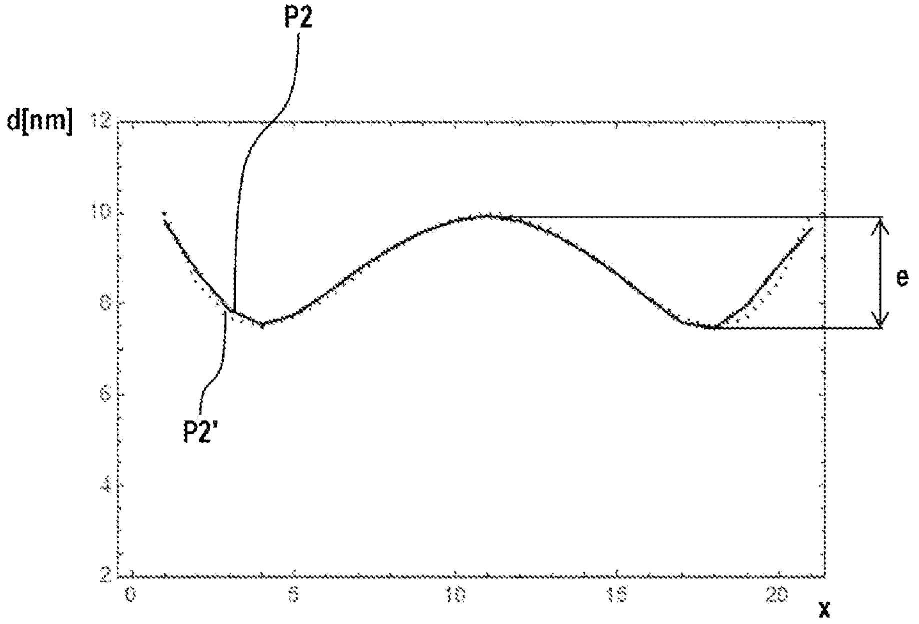
FIG. 11 shows a schematic diagram describing the optical element according to FIG. 10.

FIG. 11 shows a diagram in which the deformation d of the optically effective surface 210 of the optical element 202 according to FIG. 10 is plotted over the width direction x. In this case, only the channels 212A, 214A are subjected to the pressure p of 1 bar. The channels 212B, 214B, 212C, 214C, 212D, 214D are not subjected to pressure.

Figure 12:
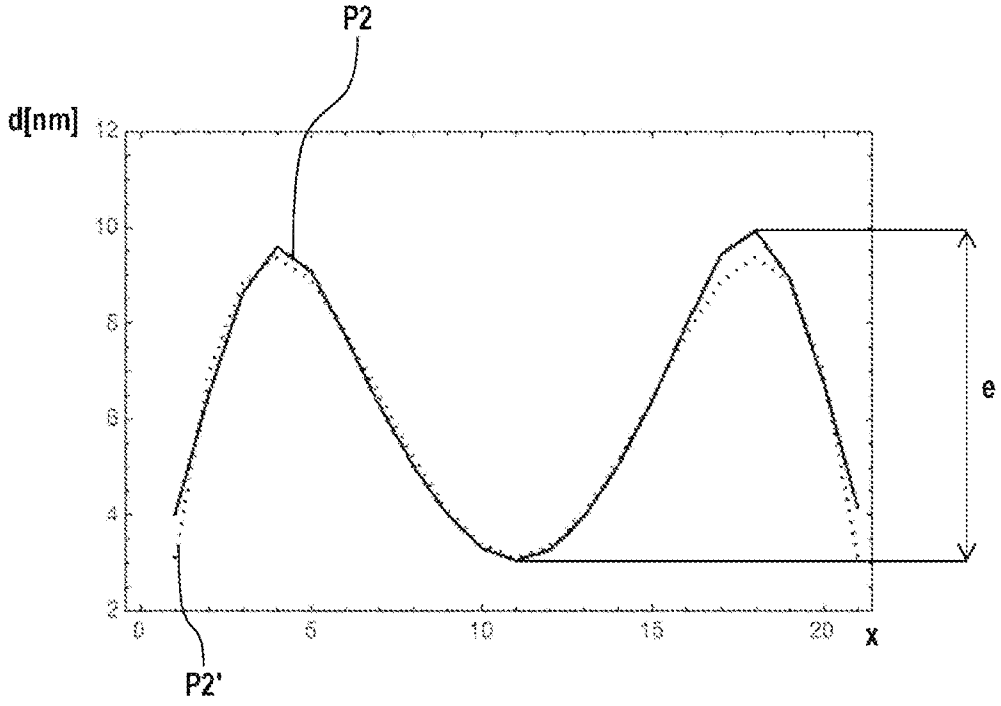
FIG. 12 shows a further schematic diagram describing the optical element according to FIG. 10.

FIG. 12 shows a further diagram, in which the deformation d of the optically effective surface 210 of the optical element 202 according to FIG. 10 is plotted over the width direction x. In this case, only the channels 212B, 214B are subjected to the pressure p of 1 bar. The channels 212A, 214A, 212C, 214C, 212D, 214D are not subjected to pressure.

Figure 13:
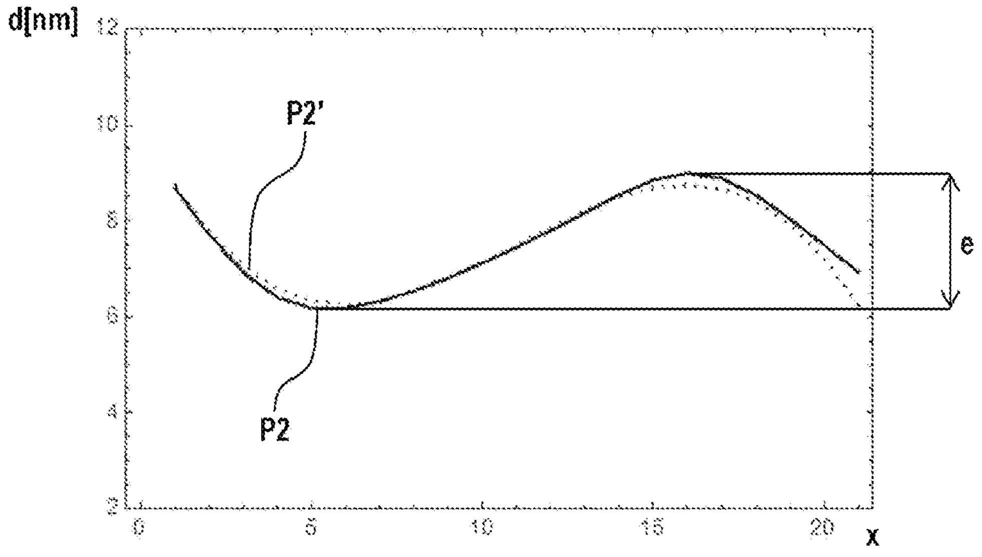
FIG. 13 shows a further schematic diagram describing the optical element according to FIG. 10.

FIG. 13 shows a further diagram, in which the deformation d of the optically effective surface 210 of the optical element 202 according to FIG. 10 is plotted over the width direction x. In this case, only the channels 212C, 214C are subjected to the pressure p of 1 bar. The channels 212A, 214A, 212B, 214B, 212D, 214D are not subjected to pressure.

Figure 14:
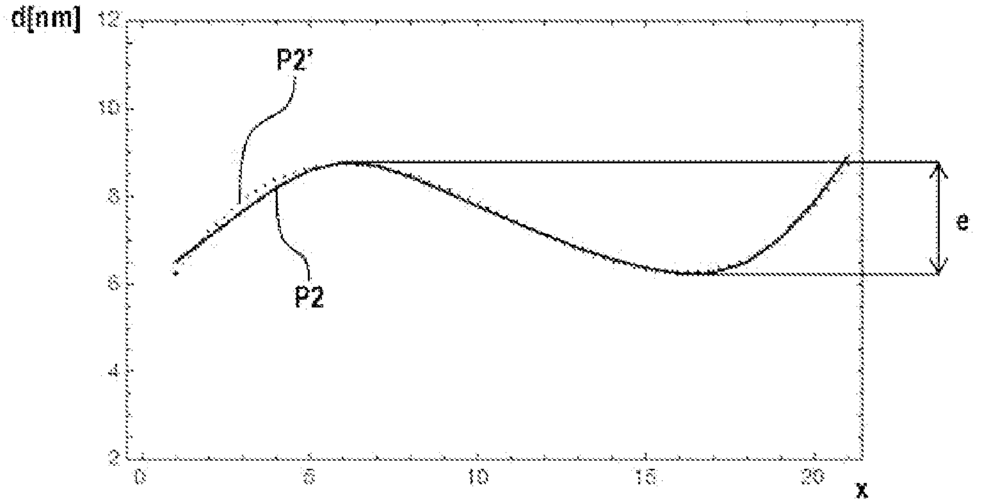
FIG. 14 shows a further schematic diagram describing the optical element according to FIG. 10.

FIG. 14 shows a further diagram, in which the deformation d of the optically effective surface 210 of the optical element 202 according to FIG. 10 is plotted over the width direction x. In this case, only the channels 212D, 214D are subjected to the pressure p of 1 bar. The channels 212A, 214A, 212B, 214B, 212C, 214C are not subjected to pressure.

By providing a number of groups of channels 212A, 214A, 212B, 214B, 212C, 214C, 212D, 214D it is possible to achieve a number of degrees of freedom when deforming the optically effective surface 210. The deformations d according to FIGS. 11 to 14 can also be overlaid by simultaneously subjecting the channels 212A, 214A, 212B, 214B, 212C, 214C, 212D, 214D to pressure. With a pressure range of 0 to 5 bar, a deformation amplitude e of 12 nm to 34 nm can be achieved.

Figure 15:
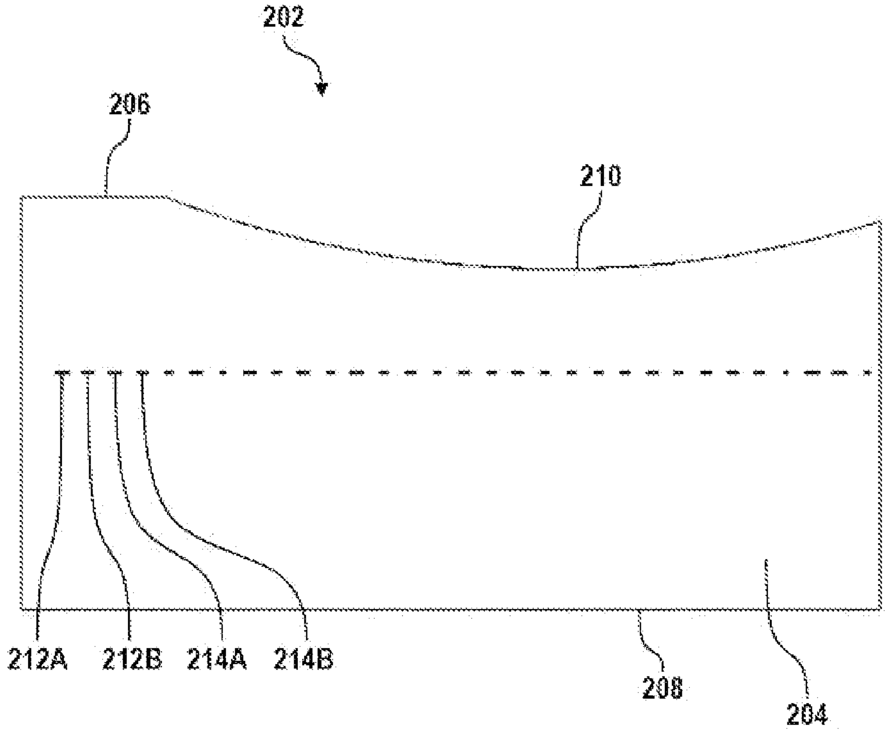
FIG. 15 shows a schematic sectional view of a further embodiment of an optical element for the optical system according to FIG. 2.

FIG. 15 shows a schematic sectional view of a further embodiment of an optical element 202. In contrast to the optical element 202 according to FIG. 10, the optical element 202 according to FIG. 15 comprises only two groups of channels 212A, 214A, 212B, 214B, which can be subjected to pressure independently of one another. The channels 212A, 214A, 212B, 214B are taken up to an edge of the optical element 202 arranged on the right in the orientation of FIG. 15.

Figure 16:
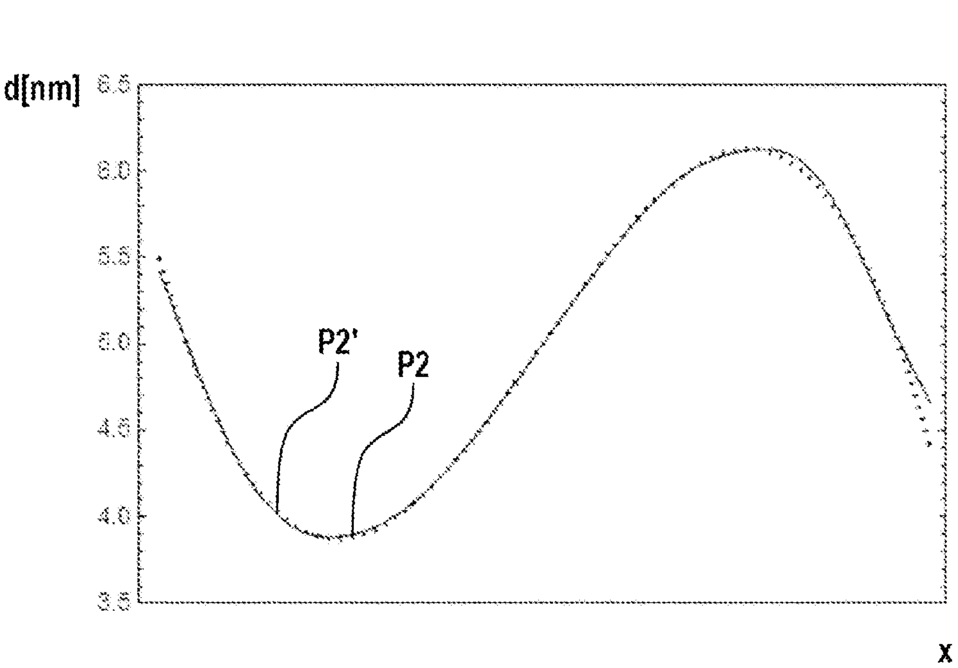
FIG. 16 shows a schematic diagram describing the optical element according to FIG. 15.

FIG. 16 shows a diagram in which the deformation d of the optically effective surface 210 of the optical element 202 according to FIG. 15 is plotted over the width direction x. In this case, only the channels 212A, 214A are subjected to the pressure p of 1 bar. The channels 212B, 214B are not subjected to pressure.

Figure 17:
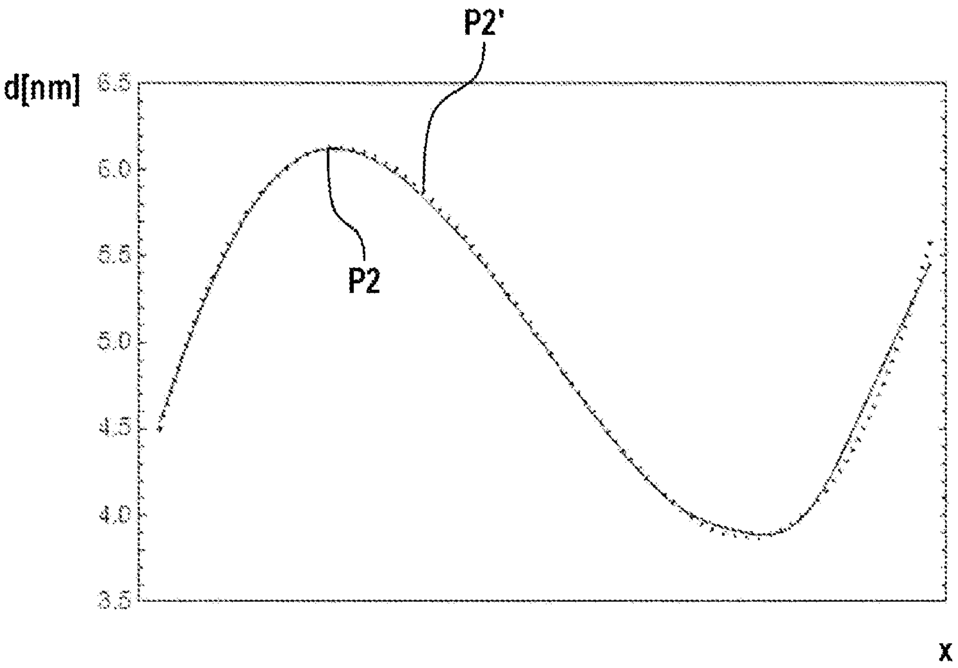
FIG. 17 shows a further schematic diagram describing the optical element according to FIG. 15.

FIG. 17 shows a further diagram, in which the deformation d of the optically effective surface 210 of the optical element 202 according to FIG. 15 is plotted over the width direction x. In this case, only the channels 212B, 214B are subjected to the pressure p of 1 bar. The channels 212A, 214A are not subjected to pressure. Together, the groups of channels 212A, 214A, 212B, 214B allow a bidirectional deformation of the optically effective surface 210 up to the edge of the optical element 202. As soon as the channels 212A, 214A, 212B, 214B are no longer subjected to pressure, there is no longer any deformation d of the optically effective surface 210.

Figure 18:
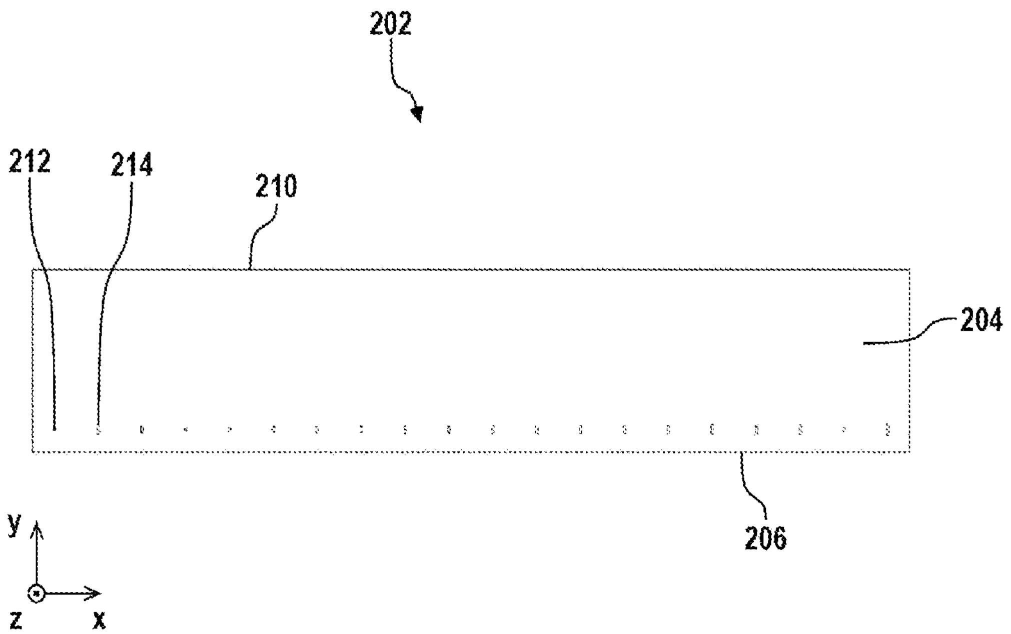
FIG. 18 shows a schematic sectional view of a further embodiment of an optical element for the optical system according to FIG. 2.

FIG. 18 shows a schematic sectional view of a further embodiment of an optical element 202. The optical element 202 has an extent of 400 mm along the width direction x. The optical element 202 has an extent of 80 mm along the height direction y. The channels 212, 214 are not oriented horizontally, but vertically. That is to say that the widths b212, b214 are smaller than the heights h212, h214. Thus, the channels 212, 214 have an aspect ratio of greater than 1. The channels 212, 214 are placed closer to the back side 208 than to the optically effective surface 210. That is to say that the distance a1 is greater than the distance a2.

When the channels 212, 214 are subjected to pressure, they apply forces to the substrate 204 which act substantially along the width direction x. The curvature of the optical element 202 can thus be influenced locally. Since the bending always takes place in one direction, as the channels 212, 214 are actuated, the curvature of the optical element 202 continues to increase. It is possible to compensate for this by for example moving the optical element 202.

Figure 19:
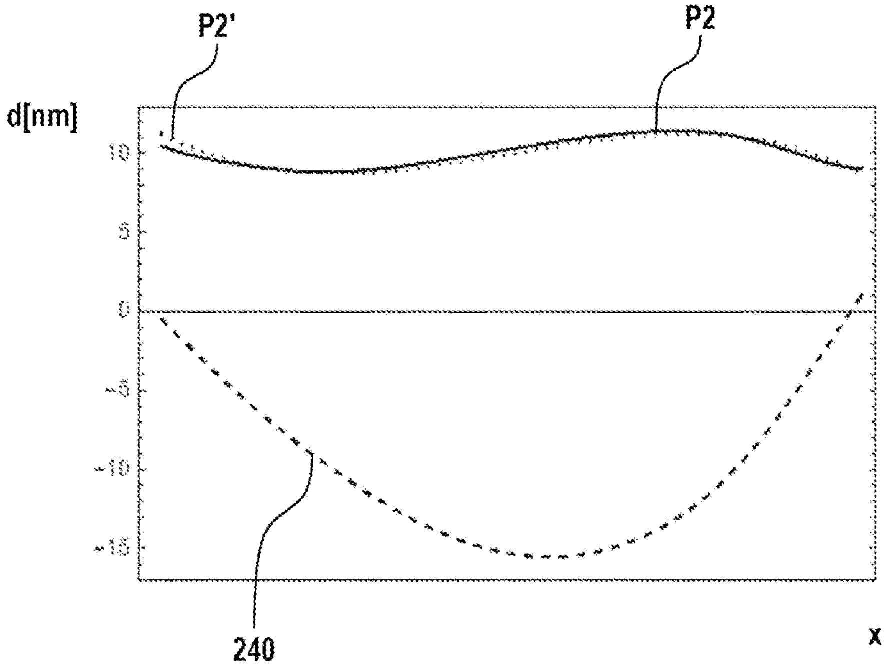
FIG. 19 shows a schematic diagram describing the optical element according to FIG. 18.

FIG. 19 shows a diagram of the deformation d of the optically effective surface 210 of the optical element 202 according to FIG. 18 when the channels 212, 214 are subjected to pressure with a pressure p of 1 bar. In this case, the deformation d of the optically effective surface 210 is plotted over the width direction x. As previously explained, the desired surface profile P2' is represented by a dashed line. The result of the deformation d of the optically effective surface 210 is represented by a dashed curve 240. The target surface profile P2 obtained in the deformed state of the optically effective surface 210 as a result of subtracting the curvature of the optically effective surface 210 from the curve 240 is shown with a solid line.

Figure 20:
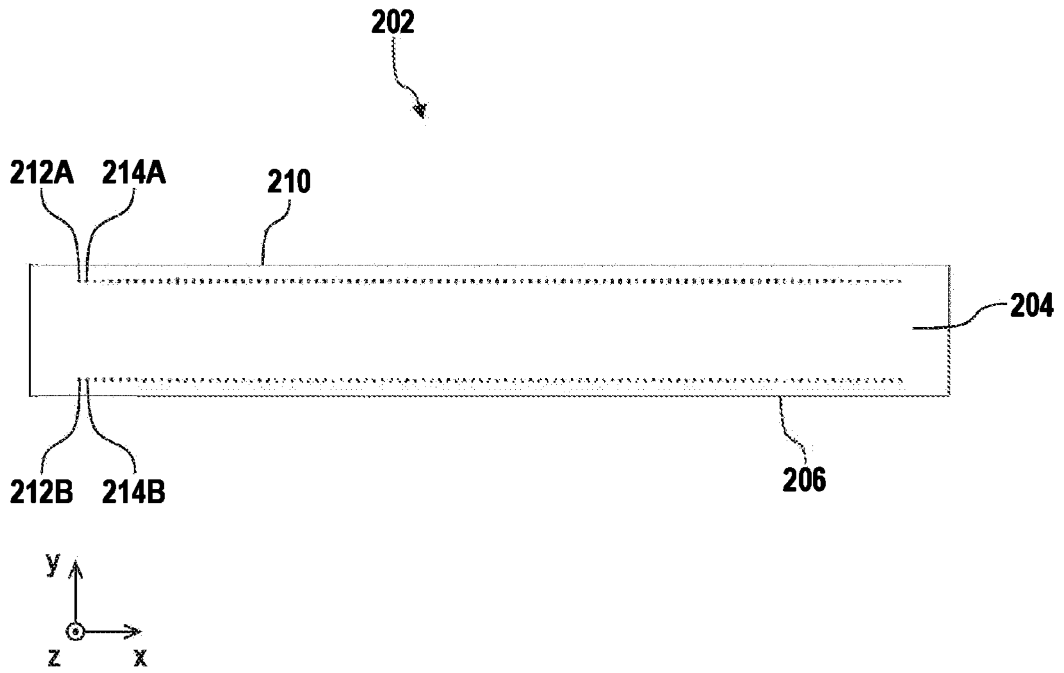
FIG. 20 shows a schematic sectional view of a further embodiment of an optical element for the optical system according to FIG. 2.

FIG. 20 shows a schematic sectional view of a further embodiment of an optical element 202. The optical element 202 has an extent of 560 mm along the width direction x. The optical element 202 has an extent of 80 mm along the height direction y. Two rows of channels 212A, 214A, 212B, 214B as previously explained with reference to FIG. 18 are provided, positioned vertically, that is to say they have an aspect ratio of greater than 1. The optically effective surface 210 is provided centered on the front side 206 and comprises a diameter of 400 mm.

The channels 212A, 214A, which are positioned near the optically effective surface 210, induce a downward bending of the optical element 202. Conversely, the channels 212B, 214B, which are positioned near the back side 208, induce an upward bending of the optical element 202. By modifying the geometry of the channels 212A, 214A, 212B, 214B, the optically effective surface 210 can be modified under pressure.

Figure 21:
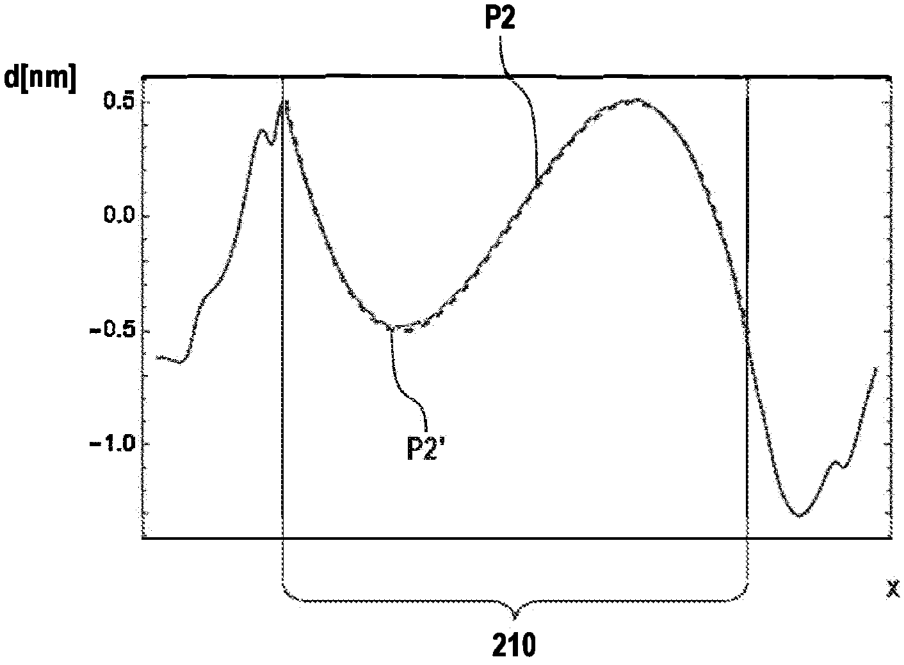
FIG. 21 shows a schematic diagram describing the optical element according to FIG. 20.

FIG. 21 shows a diagram of the deformation d of the optically effective surface 210 of the optical element 202 according to FIG. 20 when the channels 212A, 214A, 212B, 214B are subjected to pressure with a pressure p of 1 bar. The desired surface profile P2' is in this case shown with a dashed line. The target surface profile P2 is illustrated by a solid line. Within the optically effective surface 210, the target surface profile P2 follows the desired surface profile P2' very well.

Figure 22:
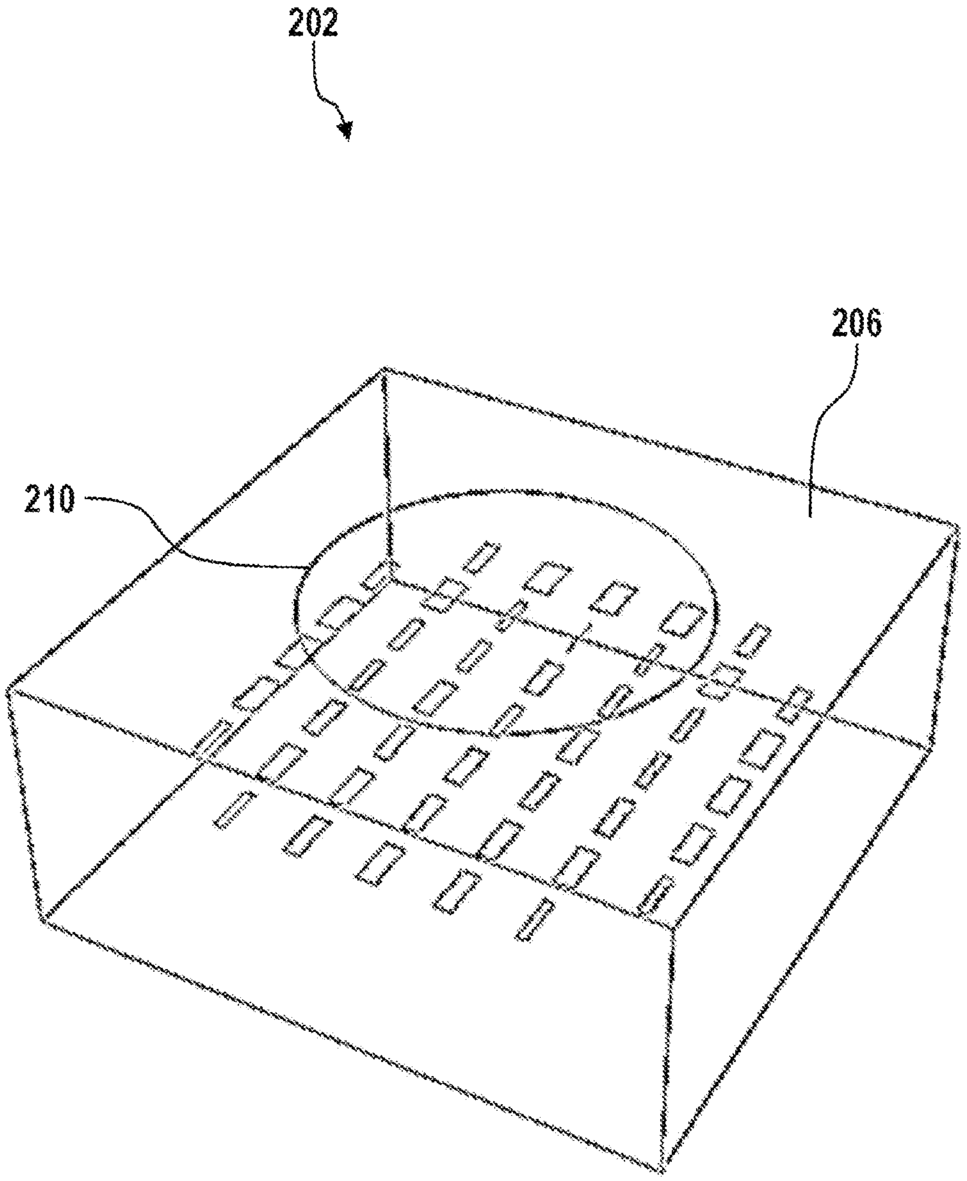
FIG. 22 shows a schematic perspective view of a further embodiment of an optical element for the optical system according to FIG. 2.
Figure 23:
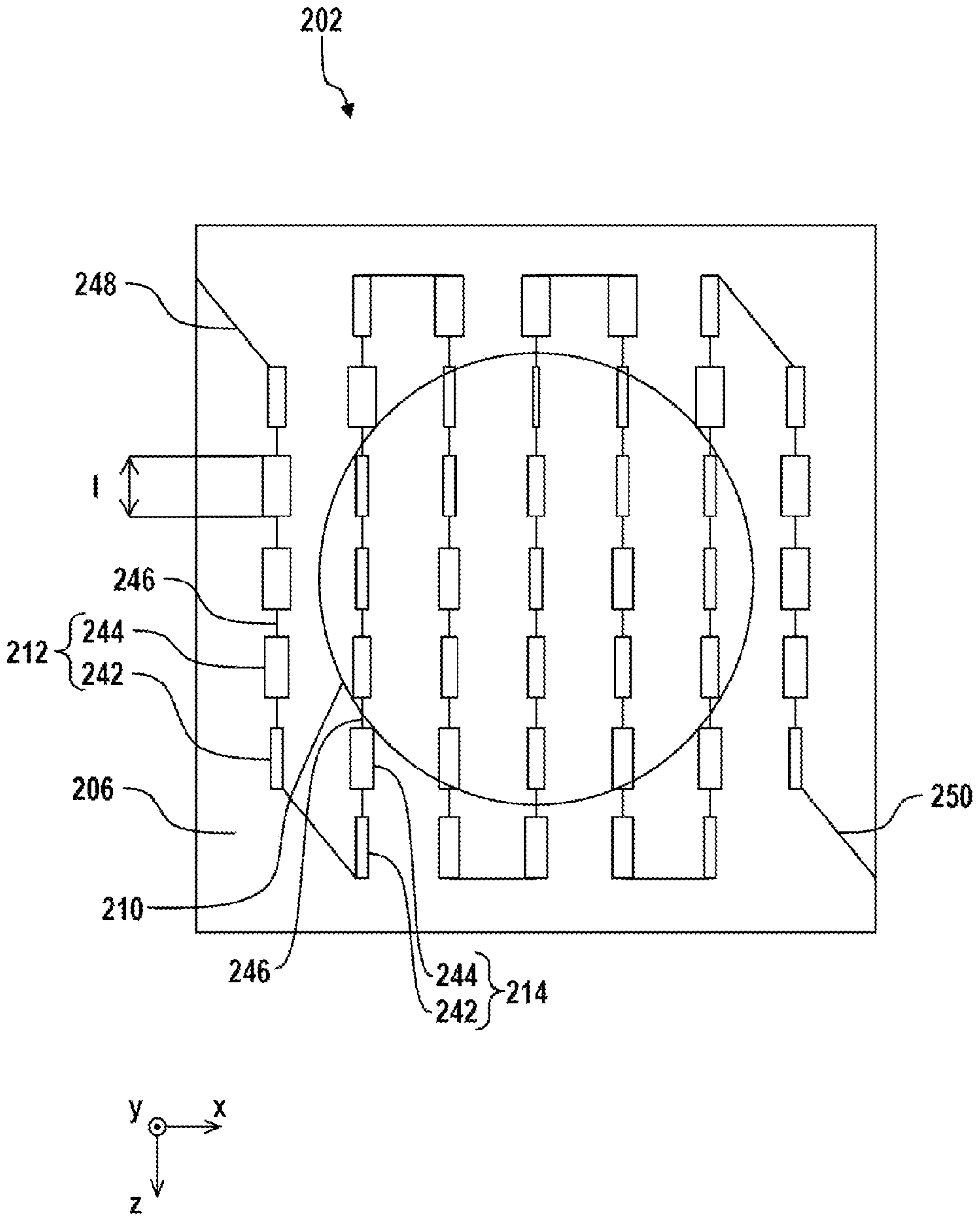
FIG. 23 shows a schematic plan view of the optical element according to FIG. 22.

FIG. 22 shows a schematic perspective view of a further embodiment of an optical element 202. FIG. 23 shows a schematic plan view of the optical element 202. The optical element 202 has an extent of 1000 mm in each case along the width direction x and along the depth direction z. The optical element 202 has an extent of 400 mm along the height direction y. The optically effective surface 210 is circular and comprises a diameter of 600 mm. The distance a1 is 200 mm and the distance c is 120 mm.

As shown in FIGS. 22 and 23, the channels 212, 214 are divided into a multiplicity of chambers or cells 242, 244, which may differ from one another in their widths b212, b214, heights h212, h214 and/or their aspect ratio. The cells 242, 244 may also differ from one another in a length 1 extending along the depth direction z. The cells 242, 244 are connected to one another with the aid of connecting lines 246. The connecting lines 246 do not contribute to the deformation d of the optically effective surface 210. All the channels 212, 214 or all the cells 242, 244 are assigned a common inlet 248 and a common outlet 250. This allows the channels 212, 214 to be flushed. The channels 212, 214 and the cells 242, 244 are connected in series or one behind the other.

Figure 24:
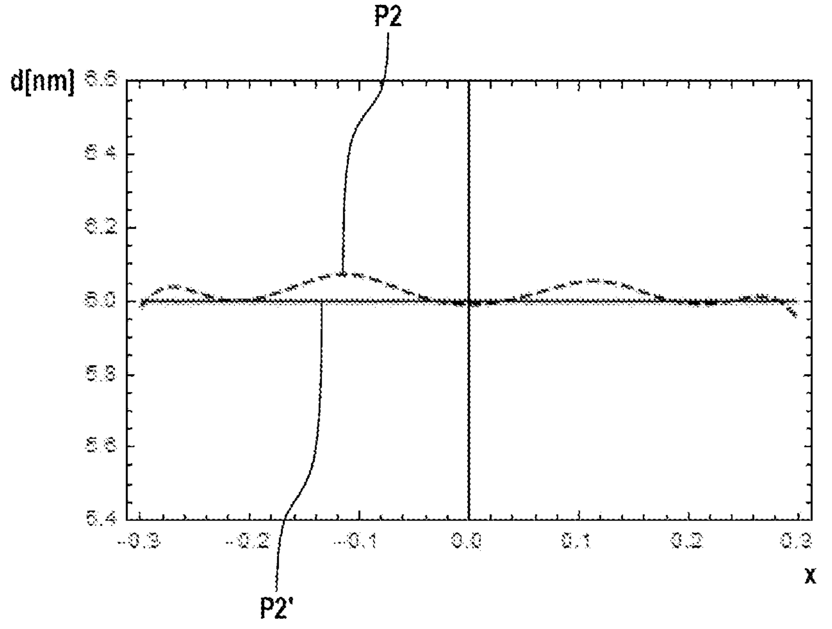
FIG. 24 shows a schematic diagram describing the optical element according to FIG. 22.
Figure 25:
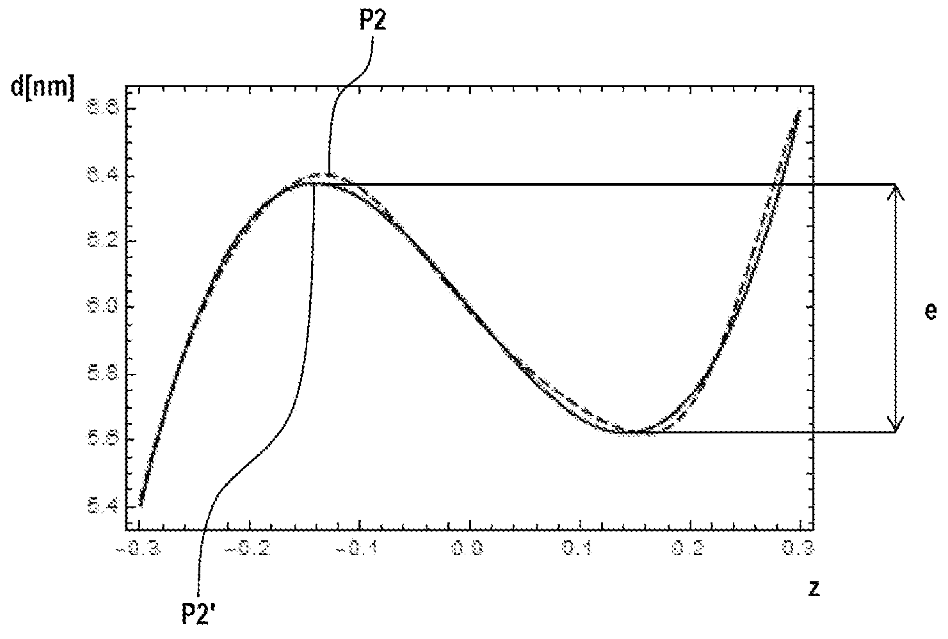
FIG. 25 shows a further schematic diagram describing the optical element according to FIG. 22.

FIGS. 24 and 25 each show a diagram of the deformation d of the optically effective surface 210 of the optical element 202 according to FIGS. 22 and 23 when the channels 212, 214 are subjected to pressure with a pressure p of 1 bar. The target surface profile P2 is shown with a dashed line and the desired surface profile P2' is shown with a solid line. A deformation amplitude e of 1.1 nm is achieved with an offset of 6.0 nm.

Figure 26:
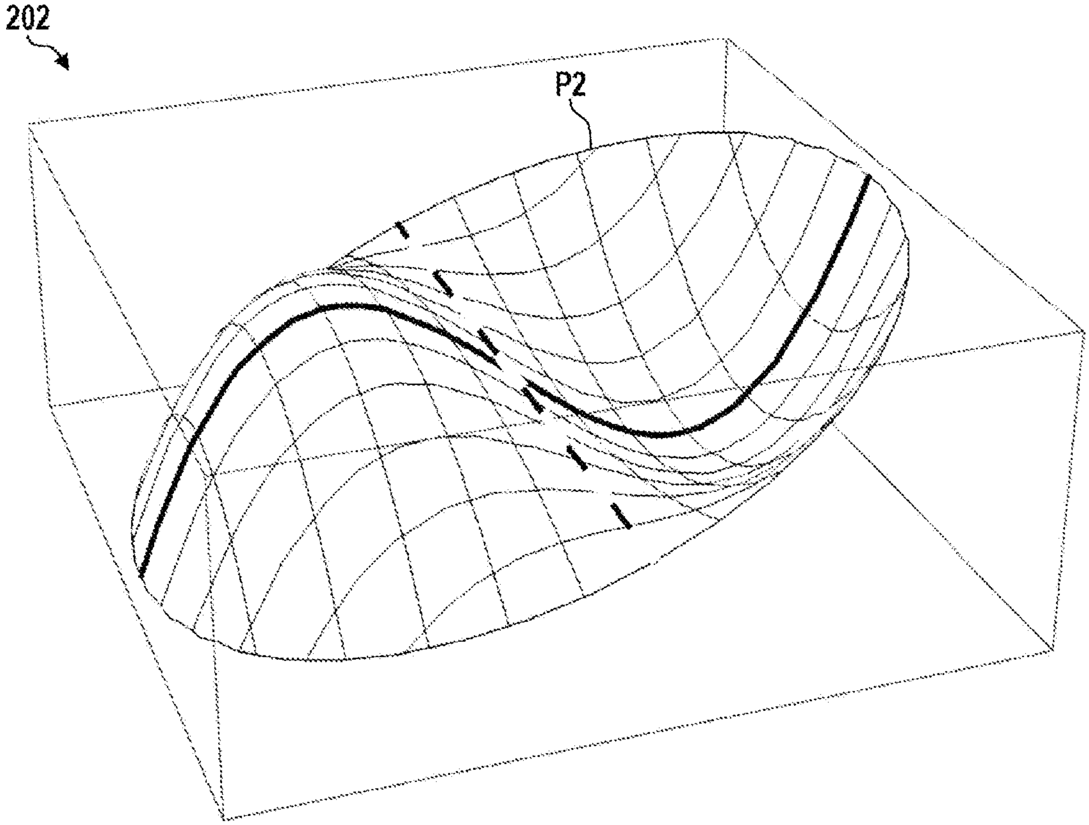
FIG. 26 shows a further schematic perspective view of the optical element according to FIG. 22.

FIG. 26 shows the target surface profile P2 of the optically effective surface 210 again in a three-dimensional representation, a section through the target surface profile P2 according to FIG. 24 being represented by a thick dashed line. A section through the target surface profile P2 according to FIG. 25 is represented by a thick solid line.

Figure 27:
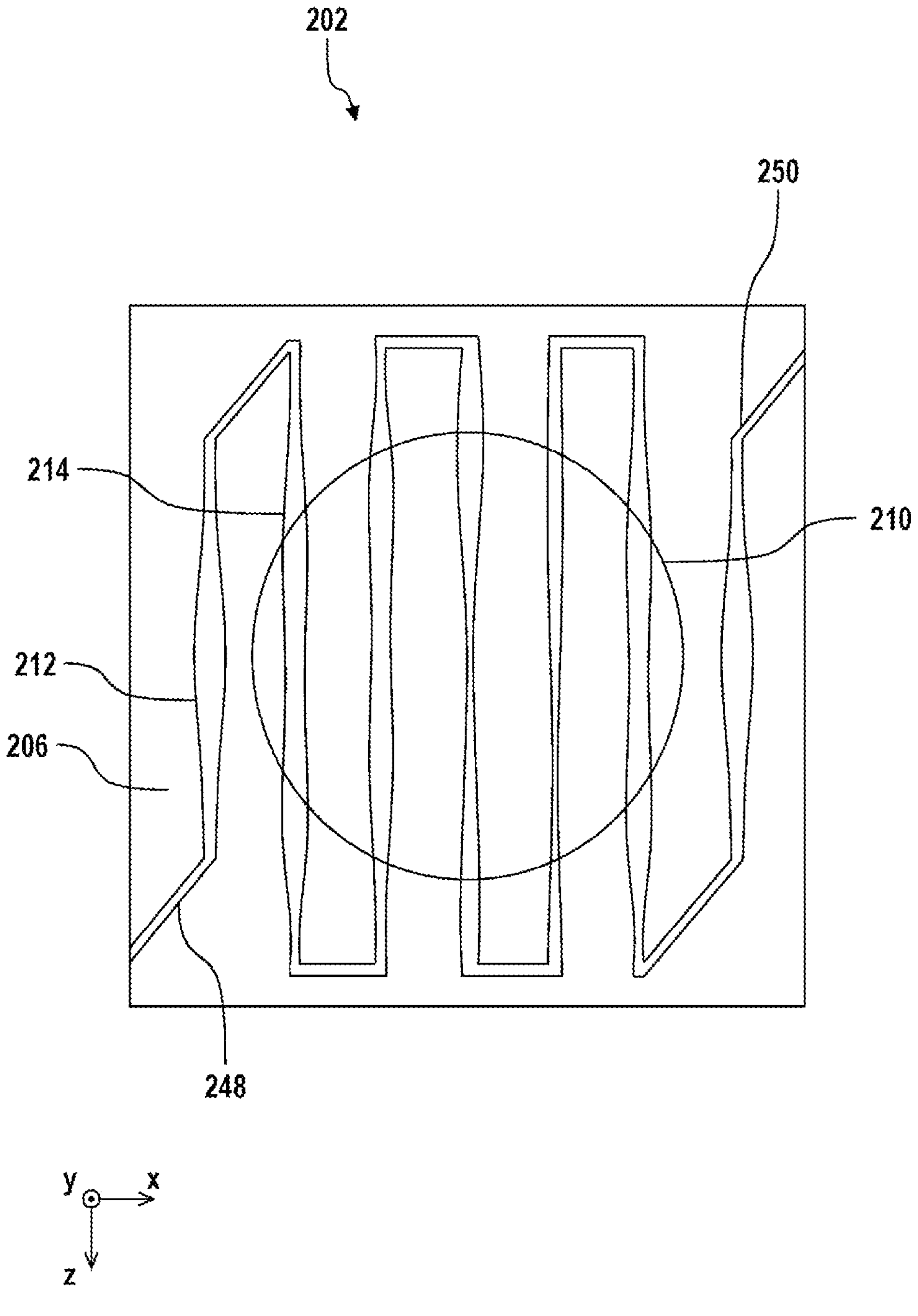
FIG. 27 shows a schematic plan view of a further embodiment of an optical element for the optical system according to FIG. 2.

FIG. 27 shows a schematic plan view of a further embodiment of an optical element 202. In contrast to the optical element 202 according to FIGS. 22 to 26, the optical element 202 according to FIG. 27 comprises channels 212, 214 which are not divided into cells 242, 244. Rather, the channels 212, 214 are formed in such a way that a width of the channels 212, 214, viewed along the width direction x, is variable. This means that, when viewed along the depth direction z, the width of the channels 212, 214 changes. The channels 212, 214 thus have constrictions and expansions.

Figure 28:
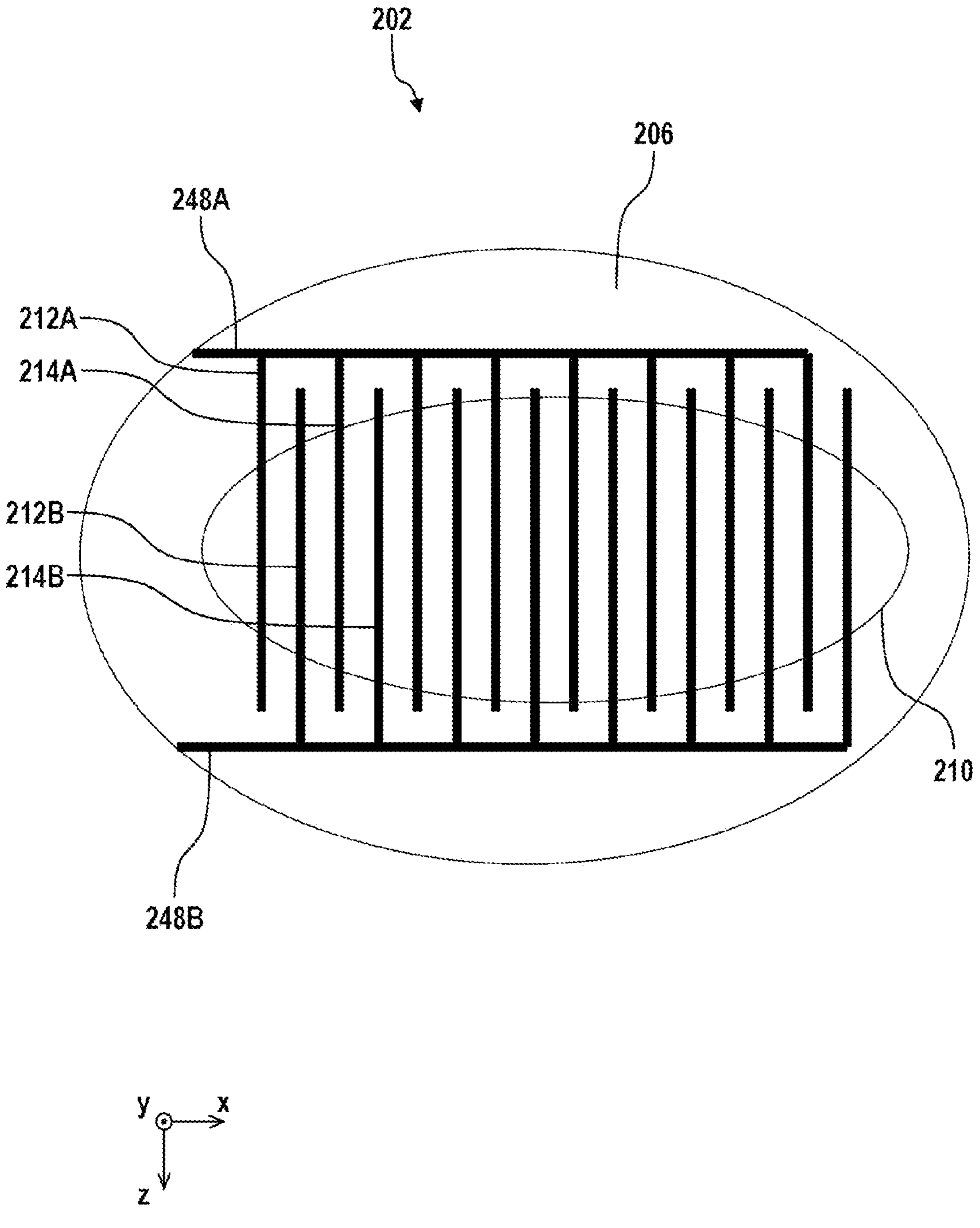
FIG. 28 shows a schematic plan view of a further embodiment of an optical element for the optical system according to FIG. 2.

FIG. 28 shows a schematic plan view of a further embodiment of an optical element 202. In this embodiment of the optical element 202, two groups of channels 212A, 214A, 212B, 214B are provided, each of which can be subjected to pressure via its own inlet 248A, 248B. The channels 212A, 214A, 212B, 214B are each connected in parallel at their assigned inlet 248A, 248B. The channels 212A, 214A, 212B, 214B lie in a common plane and engage in one another in a comb-like manner.

Figure 29:
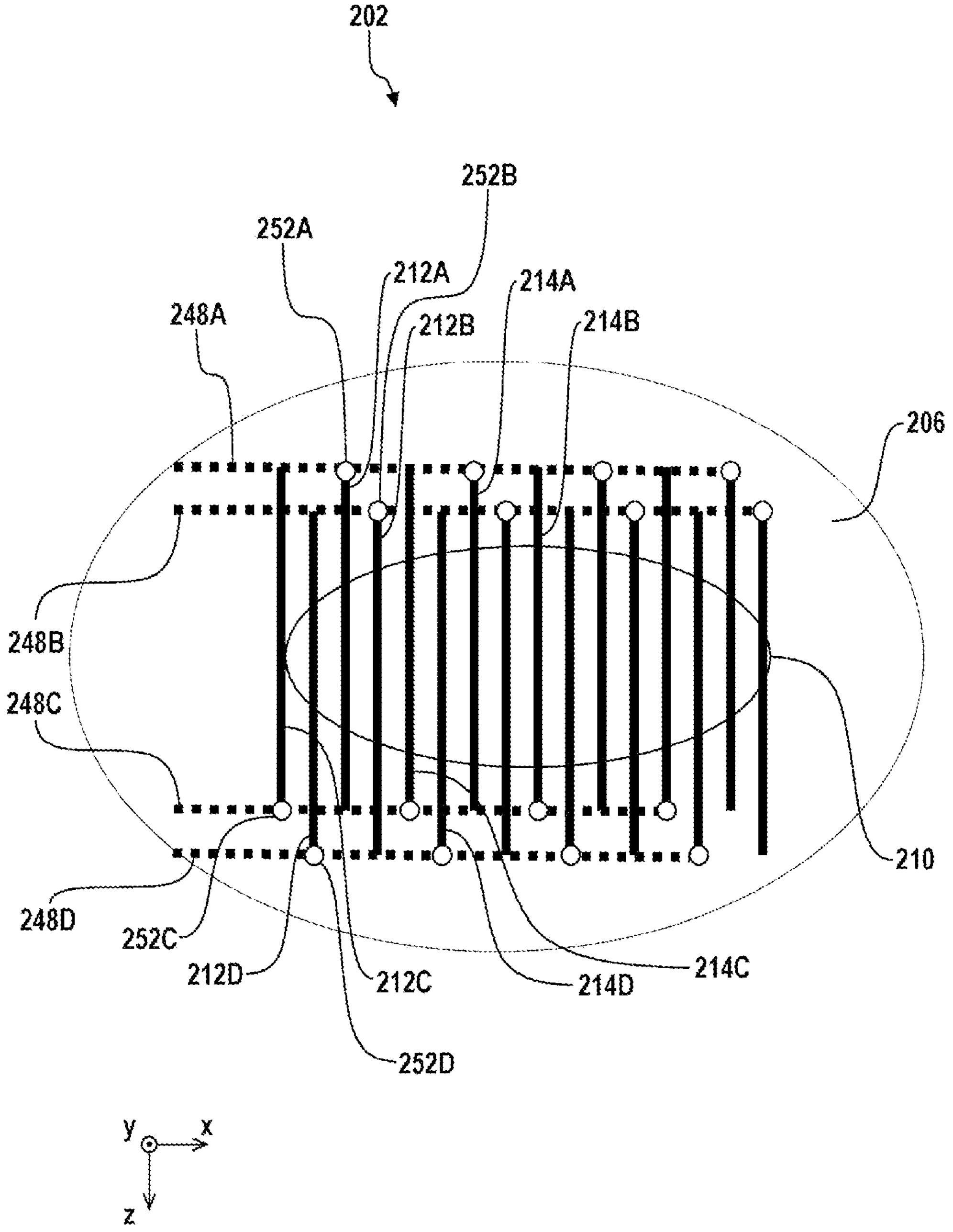
FIG. 29 shows a schematic plan view of a further embodiment of an optical element for the optical system according to FIG. 2.

FIG. 29 shows a schematic plan view of a further embodiment of an optical element 202. In this embodiment of the optical element 202, in contrast to the optical element 202 according to FIG. 28, not two, but four groups of channels 212A, 214A, 212B, 214B, 212C, 214C, 212D, 214D are provided, each of which can be subjected to pressure via its own inlet 248A, 248B, 248C, 248D.

The channels 212A, 214A, 212B, 214B, 212C, 214C, 212D, 214D are each connected in parallel at their assigned inlet 248A, 248B, 248C, 248D. All the channels 212A, 214A, 212B, 214B, 212C, 214C, 212D, 214D lie in a common plane and engage in one another in a comb-like manner. The inlets 248A, 248B, 248C, 248D are arranged in a common plane, in particular in a supply plane, which differs from the plane in which the channels 212A, 214A, 212B, 214B, 212C, 214C, 212D, 214D are arranged. From the inlets 248A, 248B, 248C, 248D, lines 252A, 252B, 252C, 252D lead along the height direction y to the channels 212A, 214A, 212B, 214B, 212C, 214C, 212D, 214D.

Figure 30:
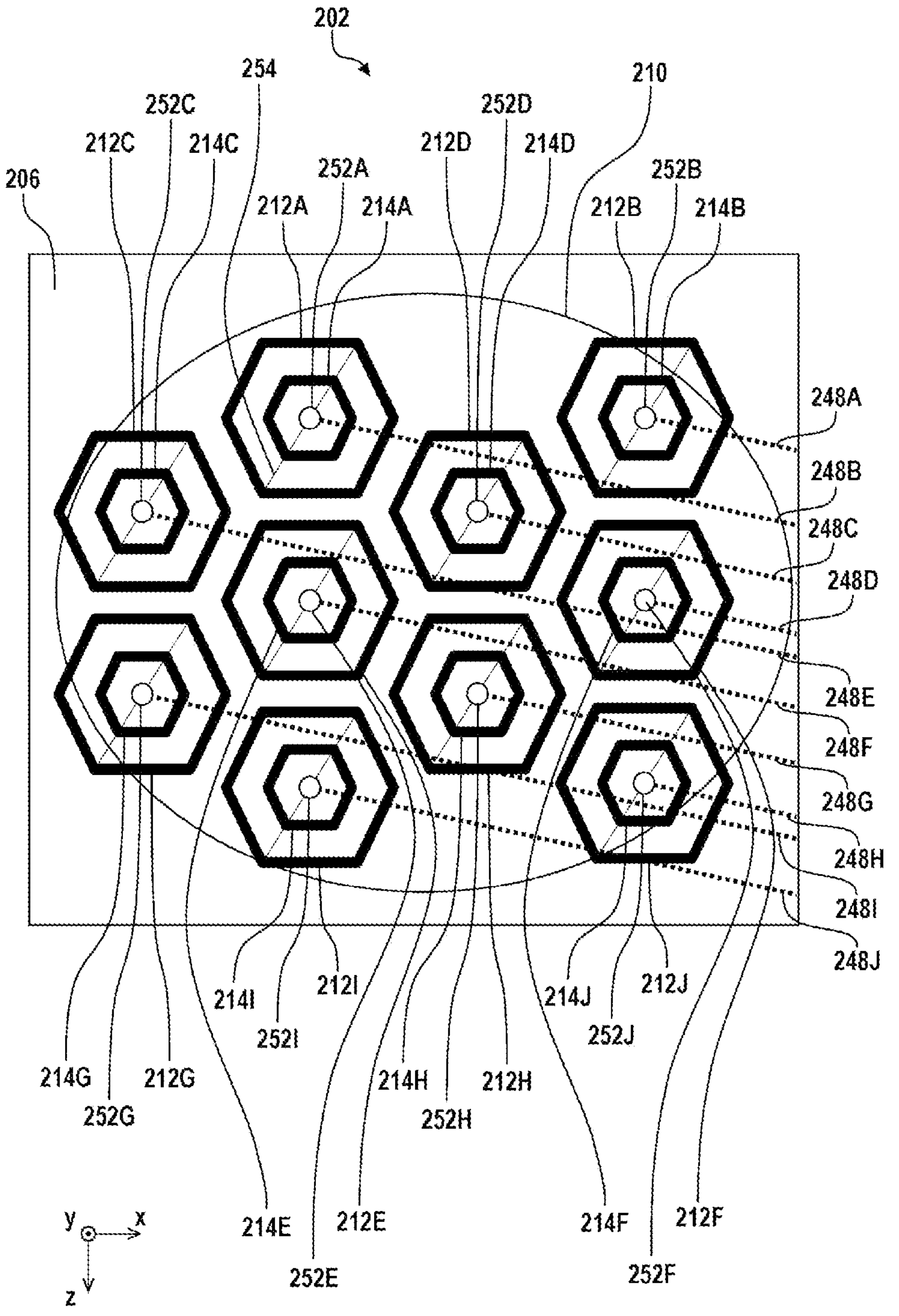
FIG. 30 shows a schematic plan view of a further embodiment of an optical element for the optical system according to FIG. 2.

FIG. 30 shows a schematic plan view of a further embodiment of an optical element 202. In this embodiment of the optical element 202, it comprises ten groups of channels 212A, 214A, 212B, 214B, 212C, 214C, 212D, 214D, 212E, 214E, 212F, 214F, 212G, 214G, 212H, 214H, 212I, 2141, 212J, 214J, all arranged in a common plane. The channels 212A, 214A, 212B, 214B, 212C, 214C, 212D, 214D, 212E, 214E, 212F, 214F, 212G, 214G, 212H, 214H, 212I, 2141, 212J, 214J have each have a hexagonal geometry. The channels 212A, 214A, 212B, 214B, 212C, 214C, 212D, 214D, 212E, 214E, 212F, 214F, 212G, 214G, 212H, 214H, 212I, 2141, 212J, 214J are arranged in pairs. This means for example that the channel 212A is assigned the channel 214A. The channels 212A, 214A are each connected to one another with the aid of a line 254.

Each pair of channels 212A, 214A, 212B, 214B, 212C, 214C, 212D, 214D, 212E, 214E, 212F, 214F, 212G, 214G, 212H, 214H, 212I, 2141, 212J, 214J is assigned its own inlet 248A, 248B, 248C, 248D, 248E, 248F, 248G, 248H, 248I, 248J. All of the inlets 248A, 248B, 248C, 248D, 248E, 248F, 248G, 248H, 248I, 248J lie in a common plane which is arranged spaced apart from the plane in which the channels 212A, 214A, 212B, 214B, 212C, 214C, 212D, 214D, 212E, 214E, 212F, 214F, 212G, 214G, 212H, 214H, 212I, 2141, 212J, 214J are positioned. Each pair of channels 212A, 214A, 212B, 214B, 212C, 214C, 212D, 214D, 212E, 214E, 212F, 214F, 212G, 214G, 212H, 214H, 212I, 2141, 212J, 214J is assigned a line 252A, 252B, 252C, 252D, 252E, 252F, 252G, 252H, 252I, 252J, which runs along the height direction y and which connects the inlets 248A, 248B, 248C, 248D, 248E, 248F, 248G, 248H, 248I, 248J to the respective associated pair of channels 212A, 214A, 212B, 214B, 212C, 214C, 212D, 214D, 212E, 214E, 212F, 214F, 212G, 214G, 212H, 214H, 212I, 2141, 212J, 214J.

Figure 31:
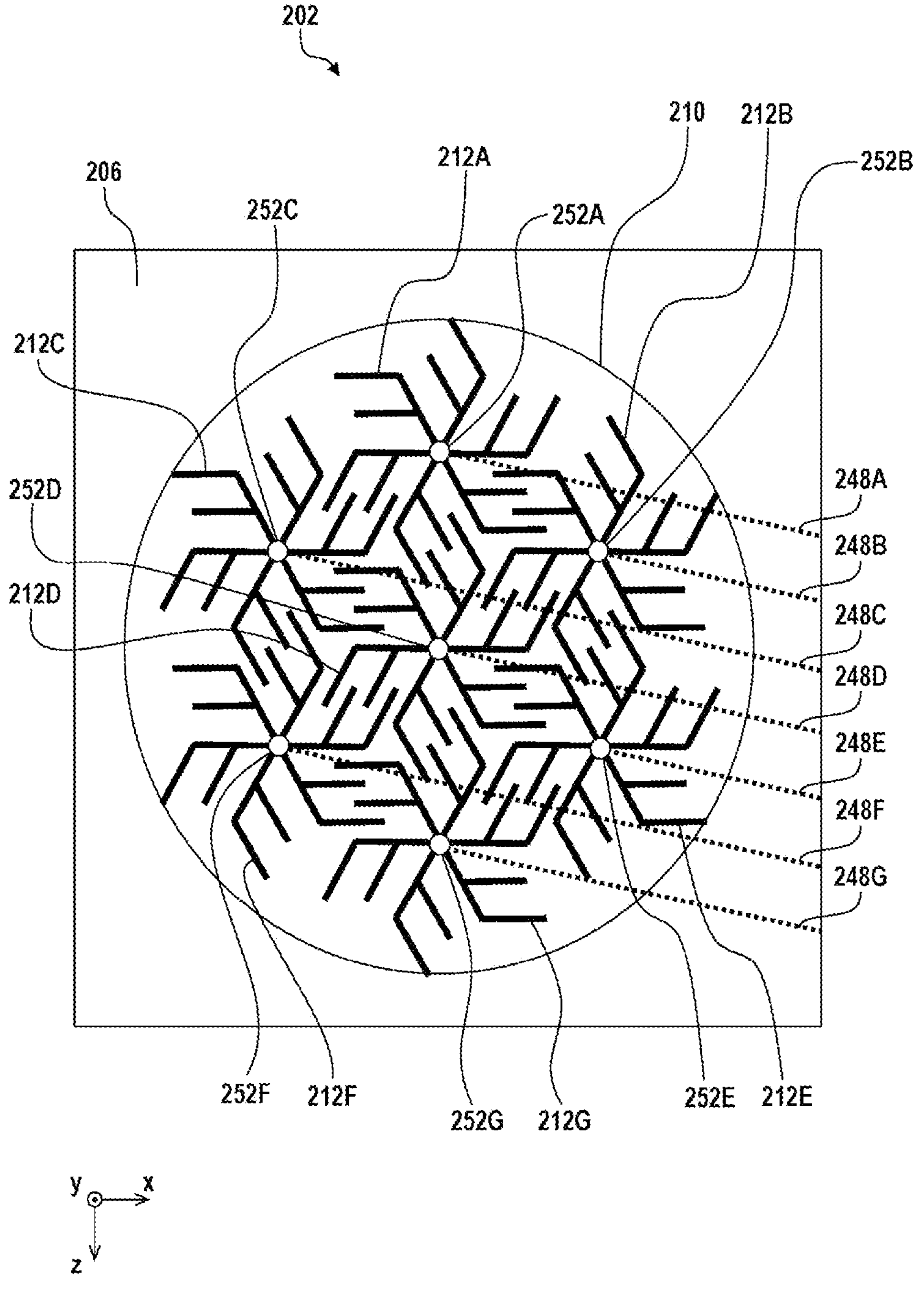
FIG. 31 shows a schematic plan view of a further embodiment of an optical element for the optical system according to FIG. 2.

FIG. 31 shows a schematic plan view of a further embodiment of an optical element 202. In this embodiment of the optical element 202, branched channels 212A, 212B, 212C, 212D, 212E, 212F, 212G are provided. The channels 212A, 212B, 212C, 212D, 212E, 212F, 212G are interleaved or overlap. As a result, when the channels 212A, 212B, 212C, 212D, 212E, 212F, 212G are subjected to pressure, pressure effects merge into one another. The channels 212A, 212B, 212C, 212D, 212E, 212F, 212G are arranged in a common plane.

Each channel 212A, 212B, 212C, 212D, 212E, 212F, 212G is assigned an inlet 248A, 248B, 248C, 248D, 248E, 248F, 248G. The inlets 248A, 248B, 248C, 248D, 248E, 248F, 248G are arranged in a common plane which differs from the plane in which the channels 212A, 212B, 212C, 212D, 212E, 212F, 212G are placed. The inlets 248A, 248B, 248C, 248D, 248E, 248F, 248G are connected to the channels 212A, 212B, 212C, 212D, 212E, 212F, 212G in fluid communication via lines 252A, 252B, 252C, 252D, 252E, 252F, 252G running along the height direction y.

Figure 32:
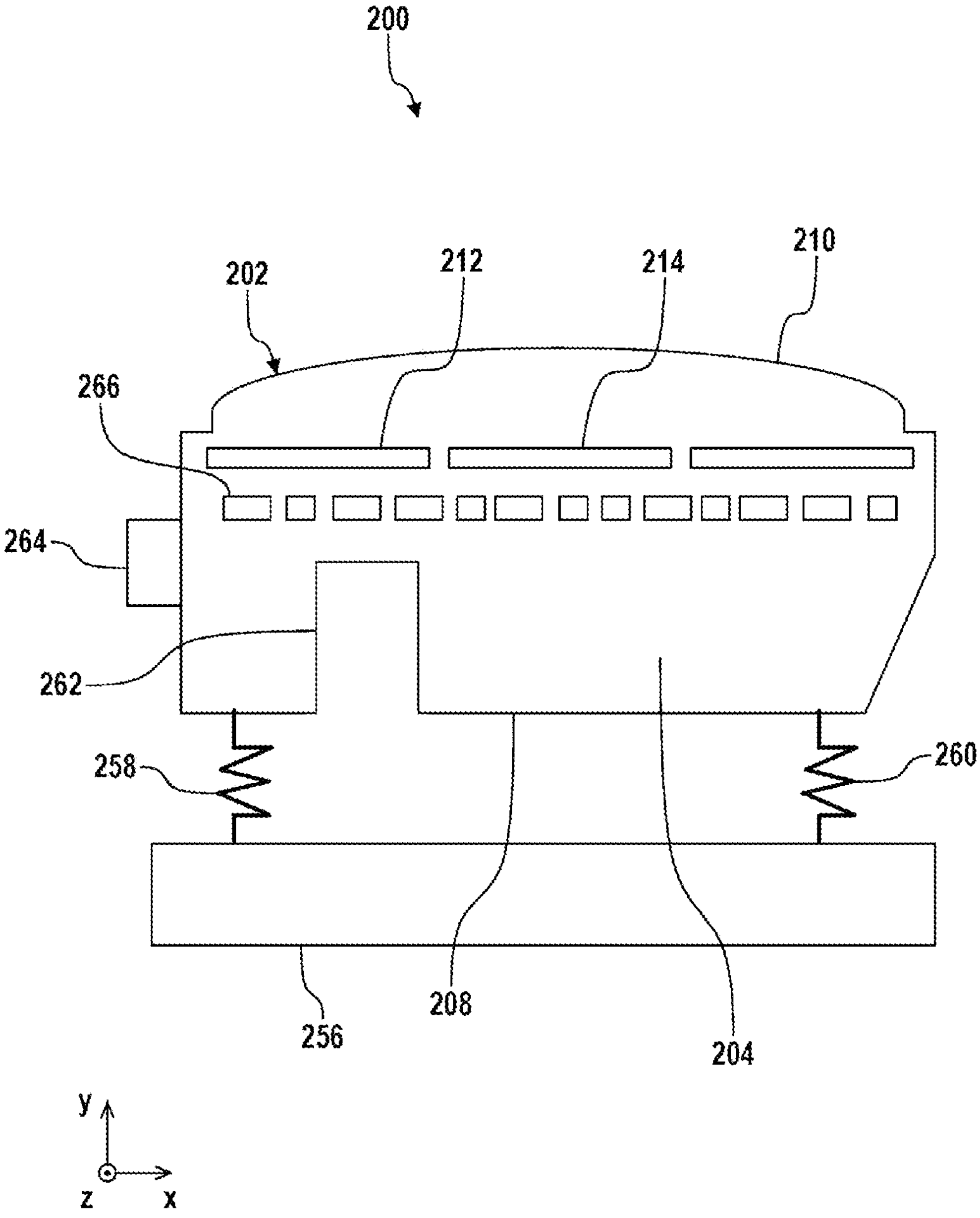
FIG. 32 shows a schematic sectional view of a further embodiment of an optical system for the lithography apparatus according to FIG. 1A or 1B.

FIG. 32 shows a schematic sectional view of a further embodiment of an optical system 200. In addition to the optical element 202, the optical system 200 comprises a supporting frame 256 (force frame). The optical element 202 is coupled to the supporting frame 256 with the aid of positioning elements or actuators 258, 260.

A recess 262 for a temperature sensor (not shown) is provided in the substrate 204. A sensor target 264 is also attached to the optical element 202. The sensor target 264 is used for referencing with the aid of a position sensor (not shown) to detect a position of the optical element 202. Further recesses, bores, material weakenings or the like may also be provided. This leads to an asymmetrical structure of the optical element 202 and to a locally changed stiffness of the optical element 202.

The optical element 202 comprises a local change in stiffness. This may be implemented for example by recesses or channels 266 provided in the substrate 204. The channels 266 are placed between the back side 208 of the optical element 202 and the channels 212, 214. The channels 266 may be irregular or regular. The channels 266 do not necessarily require a connection to an environment of the optical system 200.

Figure 33:
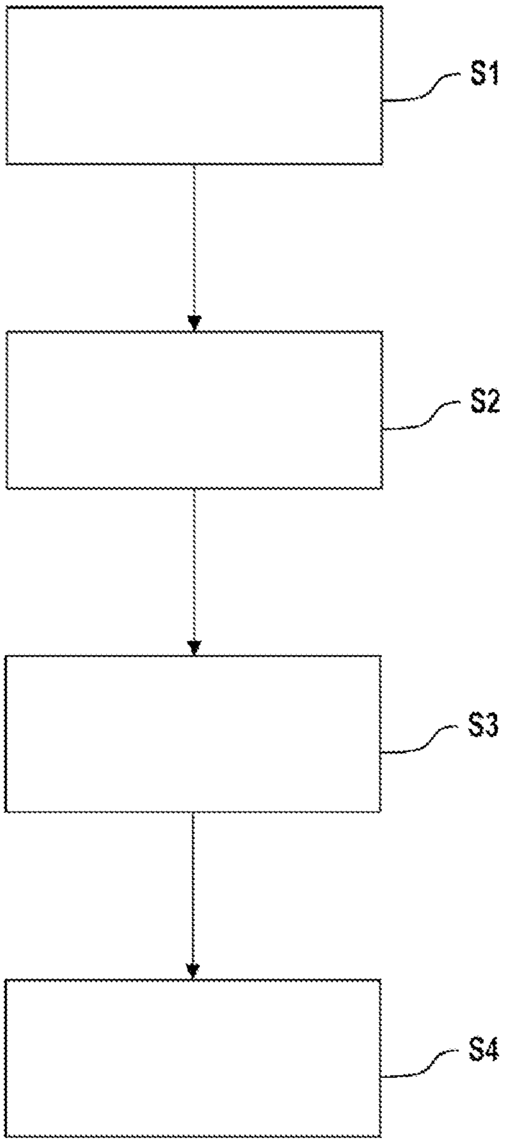
FIG. 33 shows a schematic block diagram of an embodiment of a method for producing the optical system according to FIG. 2.
Figure 34:
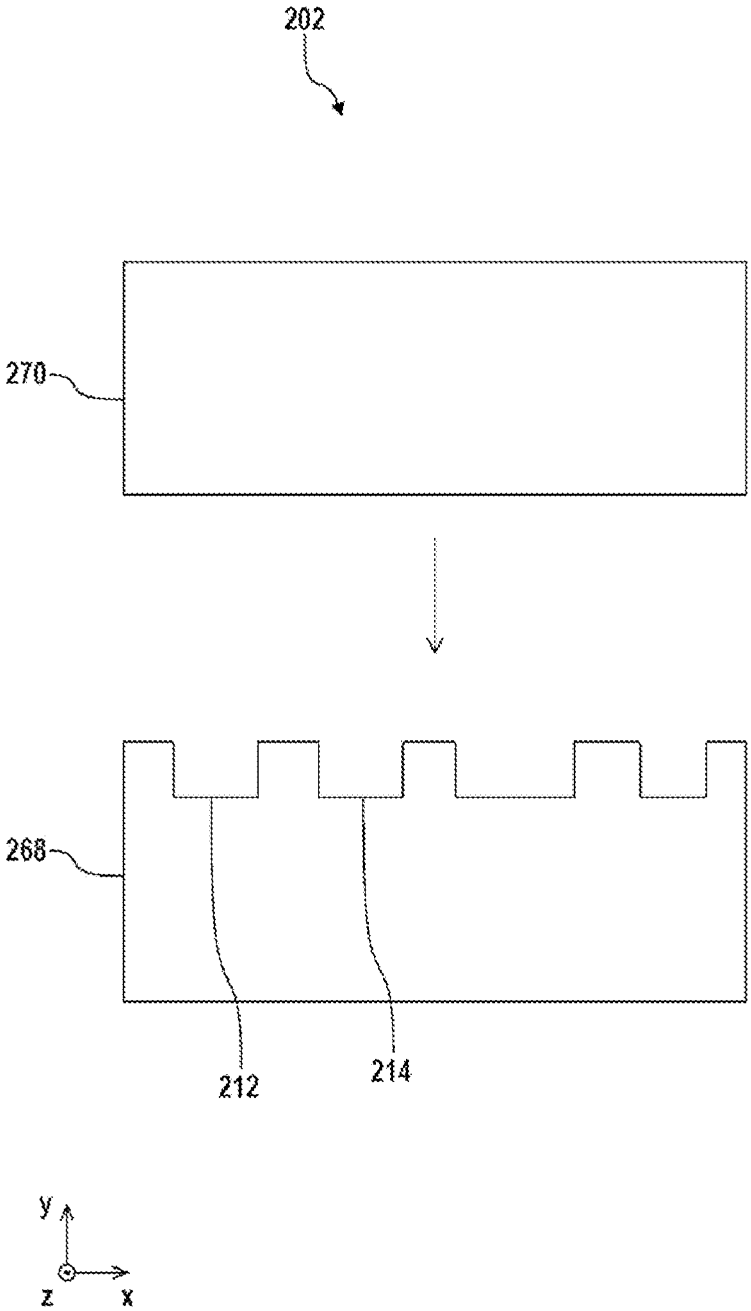
FIG. 34 shows a schematic sectional view of two substrate blocks for producing an optical element.

FIG. 33 shows a schematic block diagram of an embodiment of a method for producing an optical system 200 or an optical element 202 as explained above. FIG. 34 shows a schematic view of two substrate blocks 268, 270 which are joined together to form an optical element 202. In the following, reference is made to FIGS. 33 and 34 simultaneously.

In the method, a first substrate block 268 and a second substrate block 270 separated from the first substrate block 268 are provided in a step S1. That is to say that the substrate blocks 268, 270 are two separate components. In a step S2, a multiplicity of channels 212, 214 are introduced into the first substrate block 268. This may be carried out for example by using a machining process or an etching process. Alternatively, the channels 212, 214 may also be introduced into the second substrate block 270.

In a step S3, the channels 212, 214 are closed with the aid of the second substrate block 270. For this purpose, the second substrate block 270 is placed on the first substrate block 268, as a result of which the channels 212, 214 are closed in the height direction y. In a step S4, the first substrate block 268 and the second substrate block 270 are connected to one another. This may take place by using an optical bonding process.

Although the present disclosure has been described with reference to exemplary embodiments, it is modifiable in various ways.

LIST OF DESIGNATIONS

100A EUV lithography apparatus
100B DUV lithography apparatus
102 Beam-shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element

130 Mirror
132 Medium
200 Optical system
202 Optical element
204 Substrate
206 Front side
208 Back side
208' Back side
210 Optically effective surface
210' Optically effective surface
212 Channel
212A Channel
212B Channel
212C Channel
212D Channel
212E Channel
212F Channel
212G Channel
212H Channel
212I Channel
212J Channel
212' Channel
214 Channel
214A Channel
214B Channel
214C Channel
214D Channel
214E Channel
214F Channel
214G Channel
214H Channel
2141 Channel
214J Channel
214' Channel
216 Plane of symmetry
218 Plane of symmetry
220 Top
222 Bottom
224 Side wall
226 Side wall
228 Pressure generating device
230A Peak
230B Trough
232 Trough
234 Peak
236 Plane
238 Plane
240 Curve
242 Cells
244 Cells
246 Connecting line
248 Inlet
248A Inlet
248B Inlet
248C Inlet
248D Inlet
248E Inlet
248F Inlet
248G Inlet
248H Inlet
248J Inlet
248I Inlet
250 Outlet
252A Line
252B Line
252C Line
252D Line
252E Line
252F Line
252G Line
252H Line
252I Line
252J Line
254 Line
256 Supporting frame
258 Actuator
260 Actuator
262 Recess
264 Sensor target
266 Channel
268 Substrate block
270 Substrate block
a1 Distance
a2 Distance
b212 Width
b214 Width
c Distance
d Deformation
e Deformation amplitude
F Fluid
h212 Height
h214 Height
l Length
md Mean deformation
M1 Mirror
M2 Mirror
M3 Mirror
M4 Mirror
M5 Mirror
M6 Mirror
p Pressure
pt Print through
PV Distance
P1 Initial surface profile
P2 Target surface profile
P2' Desired surface profile
S1 Step
S2 Step
S3 Step
S4 Step
x Width direction
y Height direction
z depth direction
Z1 State
Z2 State

What is claimed is:

1. An optical system, comprising:

an optical element comprising a substrate and an optically effective surface supported by the substrate, wherein:

the optically effective surface area has an outer boundary;

a multiplicity of channels run through the substrate so that, for each channel, the channel extends underneath the optically effective surface from a first location beneath the outer boundary of the optically effective surface to a second location beneath the outer boundary of the optically effective surface;

the second location of the outer boundary of the optically effective surface is opposite the first location of the outer boundary of the optically effective surface;

the multiplicity of channels is configured to be subjected to a pressure with the aid of a fluid;

the optically effective surface is assigned an initial surface profile and a target surface profile that differs from the initial surface profile;

the optically effective surface is switchable from the initial surface profile to the target surface profile by being subjected to pressure and resultant deformation of the channels; and the channels have a variable cross section along a direction perpendicular to a direction along which the channels run.

2. The optical system of claim 1, wherein the channels comprise constrictions configured to implement the variable cross section along the direction perpendicular to the direction along which the channels run.

3. The optical system of claim 1, wherein the channels comprise expansions configured to implement the variable cross section along the direction perpendicular to the direction along which the channels run.

4. The optical system of claim 1, wherein the optically effective surface is assigned a number of target surface profiles which differ from one another only in their deformation amplitude, and wherein each target surface profile is assigned a predetermined pressure.

5. The optical system of claim 1, wherein the channels are arranged in a common plane.

6. The optical system of claim 1, wherein the channels are distributed over a number of different planes.

7. The optical system of claim 1, wherein the channels are connected in series.

8. The optical system of claim 1, wherein the channels are divided into a multiplicity of cells connected in series.

9. An apparatus, comprising:

an optical system according to claim 1, wherein the apparatus is a lithography apparatus.

10. The optical system of claim 1, wherein for each channel, the channel extends underneath the optically effective surface beyond the first location on the outer boundary of the optically effective surface and beyond the second location of the outer boundary of the optically effective surface.

11. The optical system of claim 1, further comprising an inlet and an outlet, wherein the inlet and the outlet are configured so that during use of the optical system fluid enters the multiplicity of channels via the inlet and exits the multiplicity of channels via the outlet.

12. The optical system of claim 1, further comprising a first inlet, a second inlet, a first outlet and a second outlet, wherein:

the multiplicity of channels comprises a first channel and a second channel;

the first inlet and the first outlet are configured so that during use of the optical system fluid enters the first channel via the first inlet and exits the first channel via the first outlet; and the second inlet and the second outlet are configured so that during use of the optical system fluid enters the second channel via the second inlet and exits the second channel via the second outlet.

13. An optical system, comprising:

an optical element comprising a substrate and an optically effective surface supported by the substrate, wherein:

the optically effective surface area has an outer boundary;

a multiplicity of channels run through the substrate so that, for each channel, the channel extends underneath the optically effective surface from a first location beneath the outer boundary of the optically effective surface to a second location beneath the outer boundary of the optically effective surface;

the second location of the outer boundary of the optically effective surface is opposite the first location of the outer boundary of the optically effective surface;

the multiplicity of channels is configured to be subjected to a pressure with the aid of a fluid;

the optically effective surface is assigned an initial surface profile and a target surface profile that differs from the initial surface profile;

the optically effective surface is switchable from the initial surface profile to the target surface profile by being subjected to pressure and resultant deformation of the channels;

the channels have a greater geometrical extent along a width direction of the substrate than along a height direction of the substrate; and the channels are spaced apart unequally from one another along the width direction.

14. The optical system of claim 13, wherein, along the height direction, the channels are closer to the optically effective surface than to a back side of the substrate.

15. The optical system of claim 13, wherein the channels run along a depth direction of the substrate and parallel to one another.

16. The optical system of claim 13, wherein the channels are connected in series.

17. The optical system of claim 13, wherein the channels are divided into a multiplicity of cells connected in series.

18. The optical system of claim 17, wherein the cells differ from one another in their width and/or in their height.

19. An apparatus, comprising:

an optical system according to claim 13, wherein the apparatus is a lithography apparatus.

20. The optical system of claim 13, wherein for each channel, the channel extends underneath the optically effective surface beyond the first location on the outer boundary of the optically effective surface and beyond the second location of the outer boundary of the optically effective surface.

21. The optical system of claim 13, further comprising an inlet and an outlet, wherein the inlet and the outlet are configured so that during use of the optical system fluid enters the multiplicity of channels via the inlet and exits the multiplicity of channels via the outlet.

22. The optical system of claim 13, further comprising a first inlet, a second inlet, a first outlet and a second outlet, wherein:

the multiplicity of channels comprises a first channel and a second channel;

the first inlet and the first outlet are configured so that during use of the optical system fluid enters the first channel via the first inlet and exits the first channel via the first outlet; and the second inlet and the second outlet are configured so that during use of the optical system fluid enters the second channel via the second inlet and exits the second channel via the second outlet.

* * * * *